US012690245B2

(12) United States Patent     (10) Patent No.:   US 12,690,245 B2

Lee et al.     (45) Date of Patent:    Jul. 21, 2026

(54) INTEGRATED CIRCUIT DEVICE

(71) Applicant: SAMSUNG ELECTRONICS CO., LTD., Suwon-si (KR)

(72) Inventors: Juri Lee, Suwon-si (KR); Taegon Kim, Suwon-si (KR); Sun-Ryung Oh, Suwon-si (KR); Sihyung Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 471 days.

(21) Appl. No.: 18/199,115

(22) Filed: May 18, 2023

(65) Prior Publication Data

US 2024/0096953 A1     Mar. 21, 2024

(30) Foreign Application Priority Data

Sep. 15, 2022    (KR) ........................ 10-2022-0116629

(51) Int. Cl.
| | |
|---|---|
| *H01L 23/528* | (2006.01) |
| *H01L 21/768* | (2006.01) |
| *H01L 23/522* | (2006.01) |
| *H01L 27/11565* | (2017.01) |
| *H01L 27/11582* | (2017.01) |
| *H10D 30/43* | (2025.01) |
| *H10D 30/67* | (2025.01) |
| *H10D 62/10* | (2025.01) |
| *H10D 84/85* | (2025.01) |

(52) U.S. Cl.
CPC ........... *H10D 62/121* (2025.01); *H10D 30/43* (2025.01); *H10D 30/6735* (2025.01); *H10D 30/6757* (2025.01); *H10D 84/853* (2025.01)

(58) Field of Classification Search
CPC ........... H01L 23/5283; H01L 21/76816; H01L 21/76832; H01L 23/5226; H10B 43/10; H10B 43/27; H10B 43/50; H10B 41/30; H10B 41/27; H10B 43/30; H10B 41/20; H10B 41/41; H10B 41/35; H10D 30/68
See application file for complete search history.

(56) References Cited

U.S. PATENT DOCUMENTS

| | | | |
|---|---|---|---|
| 10,128,347 | B2 | 11/2018 | Bao et al. |
| 10,546,787 | B2 | 1/2020 | Bao et al. |
| 10,586,854 | B2 | 3/2020 | Bao et al. |
| 10,692,985 | B2 | 6/2020 | Loubet et al. |
| 10,847,424 | B2 | 11/2020 | Tapily et al. |

(Continued)

FOREIGN PATENT DOCUMENTS

| | | |
|---|---|---|
| CN | 111180525 A | 5/2020 |
| CN | 113782442 A | 12/2021 |
| EP | 3709370 A1 | 9/2020 |

*Primary Examiner* — Leonardo Andujar
(74) *Attorney, Agent, or Firm* — Sughrue Mion, PLLC

(57) ABSTRACT

An integrated circuit (IC) device is provided. The IC device includes: a channel region on a substrate; a gate on the channel region; a first gate dielectric film including a first portion and a second portion, the first portion being in contact with the channel region between the channel region and the gate, and the second portion being apart from the channel region; and a second gate dielectric film including a third portion, the third portion being in contact with the second portion of the first gate dielectric film at a vertical level farther from the substrate than a top surface of the gate.

20 Claims, 38 Drawing Sheets

(56) References Cited

U.S. PATENT DOCUMENTS

| 11,107,736 | B1 | 8/2021 | Cheng et al. |
| 11,222,965 | B2 | 1/2022 | Levy et al. |
| 11,264,503 | B2 | 3/2022 | Cheng et al. |
| 11,296,078 | B2 | 4/2022 | Lee et al. |
| 11,329,139 | B2 | 5/2022 | Tsai et al. |
| 2020/0075765 | A1* | 3/2020 | Wang .................. H10D 64/667 |
| 2021/0376138 | A1 | 12/2021 | Lee et al. |
| 2022/0093773 | A1 | 3/2022 | Levy et al. |

* cited by examiner

X1 – X1'

INTEGRATED CIRCUIT DEVICE

CROSS-REFERENCE TO RELATED APPLICATION

This application claims priority to Korean Patent Application No. 10-2022-0116629, filed on Sep. 15, 2022, in the Korean Intellectual Property Office, the disclosure of which is incorporated herein by reference in its entirety.

BACKGROUND

The present disclosure relates to an integrated circuit (IC) device, and more particularly, to an IC device including a field-effect transistor (FET).

With the development of electronics technology, the downscaling of IC devices has progressed rapidly. In recent years, because semiconductor devices require not only a high operating speed but also operating accuracy, a vast amount of research has been conducted to optimize structures of transistors included in the semiconductor devices.

SUMMARY

One or more example embodiments provide an integrated circuit (IC) device, which has a device region with a reduced area with a downscaling trend and includes a transistor having an optimized work function without causing undesired structural damage therein.

According to an aspect of an example embodiment, an IC device includes: a channel region on a substrate; a gate on the channel region; a first gate dielectric film including a first portion and a second portion, the first portion being in contact with the channel region between the channel region and the gate, and the second portion being apart from the channel region; and a second gate dielectric film including a third portion, the third portion being in contact with the second portion of the first gate dielectric film at a vertical level farther from the substrate than a top surface of the gate.

According to another aspect of an example embodiment, an IC device includes: a first fin-type active region extending in a first lateral direction on a first region of a substrate; a first channel region on the first fin-type active region; a first gate surrounding the first channel region on the first fin-type active region, the first gate extending in a second lateral direction that intersects the first lateral direction; a first gate dielectric film including a first portion and a second portion, the first portion being in contact with the first channel region between the first channel region and the first gate, and the second portion being apart from the first channel region; and a second gate dielectric film including a third portion, the third portion being in contact with the second portion of the first gate dielectric film at a vertical level farther from the substrate than a top surface of the first gate.

According to another aspect of an example embodiment, an IC device includes: integrated circuit device including: a fin-type active region on a substrate; a channel region on the fin-type active region; a gate surrounding the channel region on the fin-type active region; a pair of source/drain regions on both sides of the channel region on the fin-type active region; a first gate dielectric film including a first portion and a second portion, the first portion being in contact with the channel region between the channel region and the gate, and the second portion being apart from the channel region; a second gate dielectric film including a third portion and a fourth portion, the third portion being in contact with the second portion of the first gate dielectric film at a vertical level farther from the substrate than a top surface of the gate, and the fourth portion being in contact with the top surface of the gate; a capping insulating pattern covering the top surface of the gate with the second gate dielectric film therebetween; and insulating spacers covering sidewalls of each of the gate and the capping insulating pattern. Each of the second portion of the first gate dielectric film and the third portion of the second gate dielectric film includes a portion extending in a vertical direction between the capping insulating pattern and the insulating spacers, and the second gate dielectric film includes a high-k dielectric film not including a dipole dopant, the high-k dielectric film including the dipole dopant or a combination thereof.

BRIEF DESCRIPTION OF DRAWINGS

The above and other aspects and features will be more apparent from the following description of example embodiments, taken in conjunction with the accompanying drawings in which.

DETAILED DESCRIPTION

Figure 1:
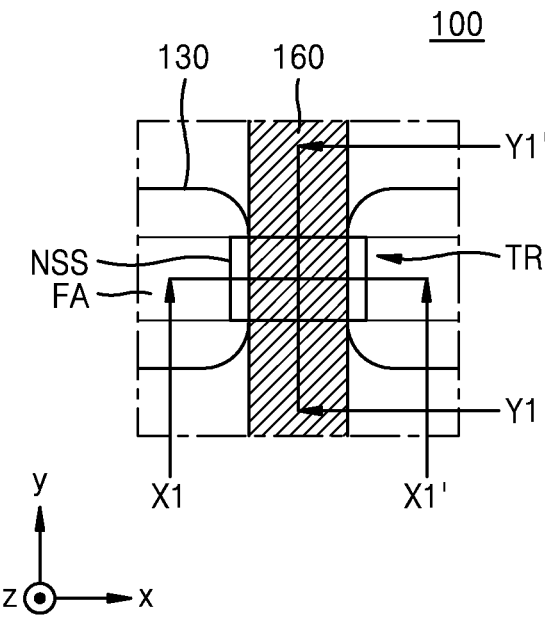
FIG. 1 is a plan layout diagram of some components of an integrated circuit (IC) device according to example embodiments.

Hereinafter, embodiments will be described in detail with reference to the accompanying drawings. Embodiments described herein are example embodiments, and thus, the present disclosure is not limited thereto, and may be realized in various other forms. Each embodiment provided in the following description is not excluded from being associated with one or more features of another example or another embodiment also provided herein or not provided herein but consistent with the present disclosure. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. It will be also understood that, even if a certain step or operation of manufacturing an apparatus or structure is described later than another step or operation, the step or operation may be performed later than the other step or operation unless the other step or operation is described as being performed after the step or operation. The same reference numerals are used to denote the same elements in the drawings, and repeated descriptions thereof are omitted. In the following detailed description and claims, it will be understood that, although the terms first, second, etc. may be used herein to describe various elements, these elements should not be limited by these terms. These terms are only used to distinguish one element from another.

Figure 2A:
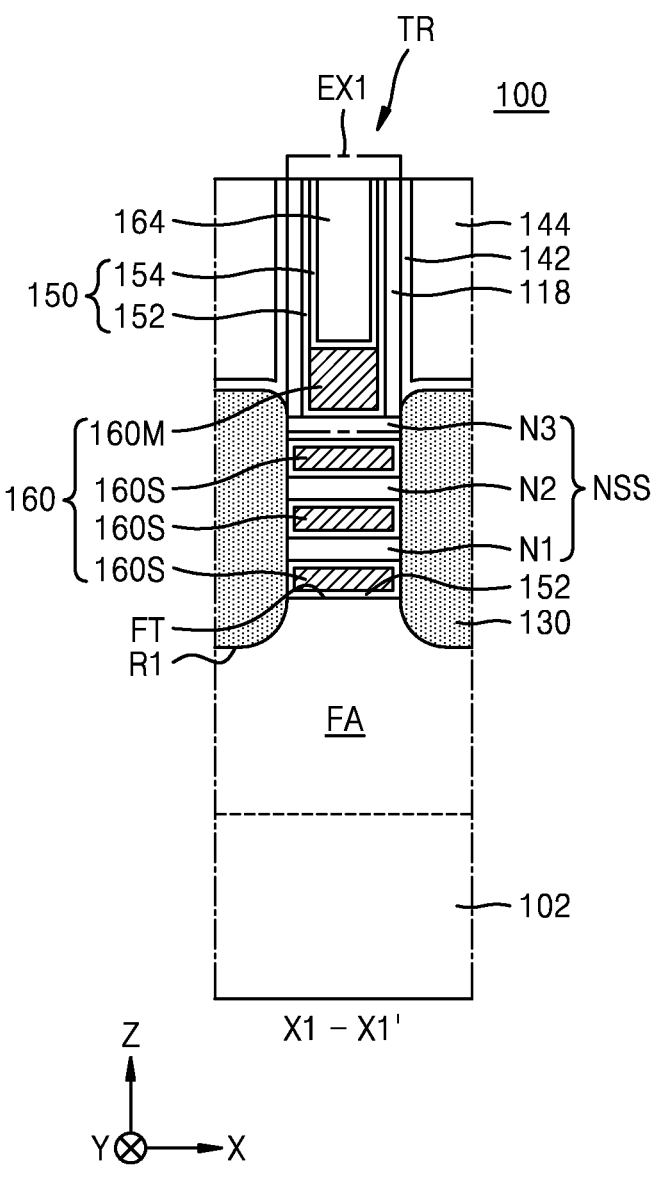
FIG. 2A is a cross-sectional view taken along line X1-X1' of FIG. 1.
Figure 2B:
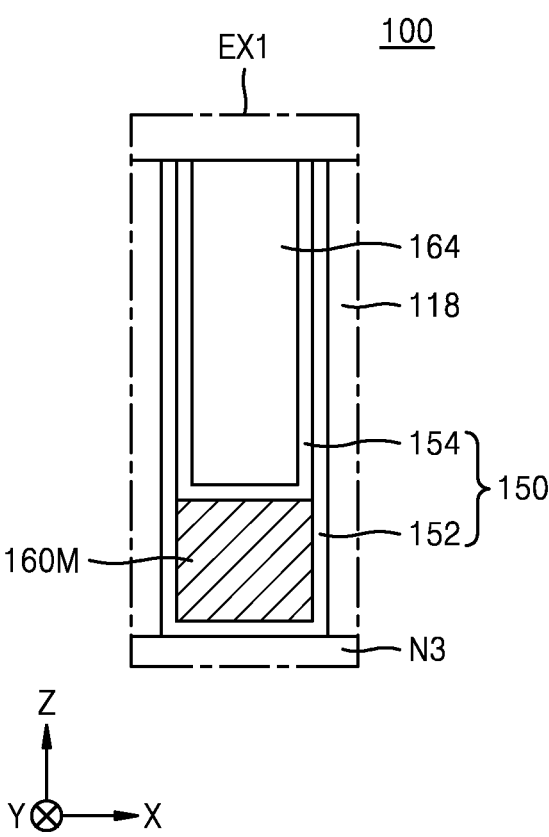
FIG. 2B is an enlarged cross-sectional view of a local region "EX1" of FIG. 2A.
Figure 2C:
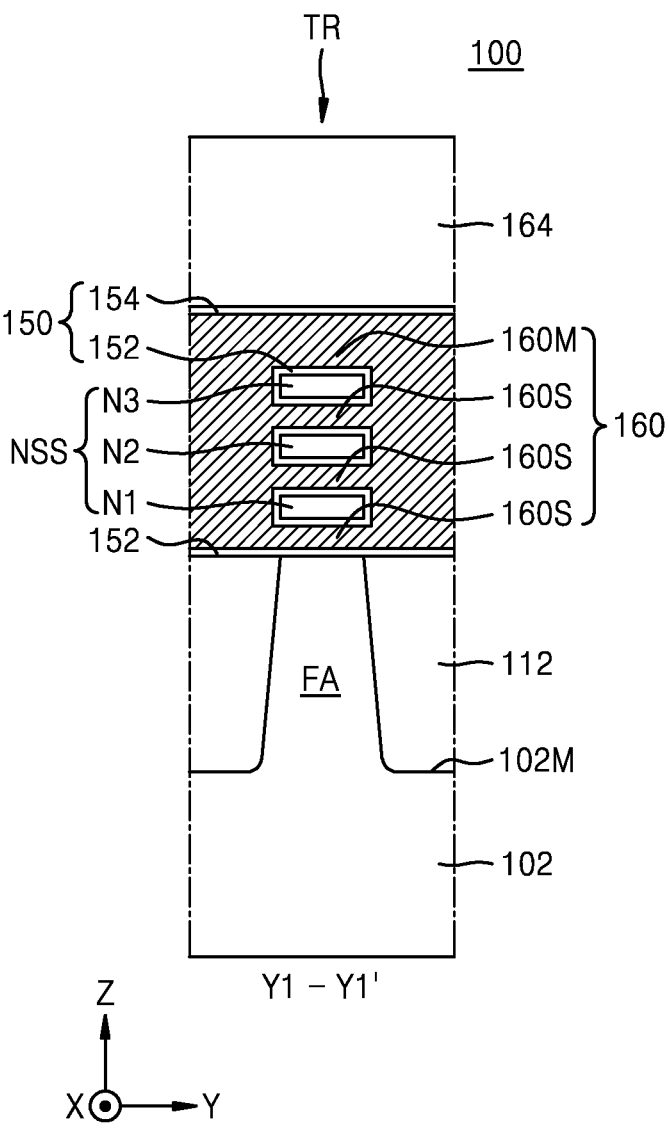
FIG. 2C is a cross-sectional view taken along line Y1-Y1' of FIG. 1.

FIG. 1 is a plan layout diagram of some components of an integrated circuit (IC) device 100 according to example embodiments. FIG. 2A is a cross-sectional view taken along line X1-X1' of FIG. 1. FIG. 2B is an enlarged cross-sectional view of a local region "EX1" of FIG. 2A. FIG. 2C is a cross-sectional view taken along line Y1-Y1' of FIG. 1. The IC device 100 includes field-effect transistors (FETs) which have, for example, a gate-all-around structure including an active region of a nanowire or nanosheet type and a gate surrounding the active region is described with reference to FIGS. 1 and 2A to 2C.

Referring to FIGS. 1 and 2A to 2C, the IC device 100 may include a fin-type active region FA, which may protrude upward from a substrate 102 in a vertical direction (Z direction) and extend in a first lateral direction (X direction). A nanosheet stacks NSS may be on the fin-type active region FA. The nanosheet stack NSS may include at least one nanosheet facing a fin top surface FT of the fin-type active region FA at a position apart from the fin top surface FT of the fin-type active region FA in a vertical direction (Z direction). As used herein, the term "nanosheet" refers to a conductive structure having a cross-section that is substantially perpendicular to a direction in which current flows. The nanosheet may be interpreted as including a nanowire.

The substrate 102 may include a semiconductor, such as silicon (Si) or germanium (Ge), or a compound semiconductor, such as silicon germanium (SiGe), silicon carbide (SiC), gallium arsenide (GaAs), indium arsenide (InAs), indium gallium arsenide (InGaAs), or indium phosphide (InP). As used herein, each of the terms "SiGe," "SiC," "GaAs," "InAs," "InGaAs," and "InP" refers to a material including elements included therein, without referring to a chemical formula representing a stoichiometric relationship.

As shown in FIG. 2C, a device isolation film 112 covering both sidewalls of the fin-type active regions FA may be on the substrate 102. The device isolation film 112 may include an oxide film, a nitride film, or a combination thereof.

A gate line 160 may be on the fin-type active region FA. On the fin-type active region FA and the device isolation film 112, the gate line 160 may extend in a second lateral direction (Y direction), which is perpendicular to the first lateral direction (X direction). The nanosheet stack NSS may be on the fin top surface FT of the fin-type active region FA in a portion of the IC device 100 where the fin-type active region FA intersects with the gate line 160. As shown in FIG. 1, a transistor TR may be formed in the portion where the fin-type active region FA intersects with the gate line 160. The transistor TR may be a P-type metal-oxide-semiconductor field-effect transistor (PMOS transistor) or an N-type metal-oxide-semiconductor field-effect transistor (NMOS transistor). The transistor TR may constitute a logic circuit or a memory device.

The nanosheet stack NSS may include a plurality of nanosheets (e.g., a first nanosheet N1, a second nanosheet N2, and a third nanosheet N3), which overlap each other in the vertical direction (Z direction) on the fin-type active region FA. The first nanosheet N1, the second nanosheet N2, and the third nanosheet N3 may be at different vertical distances (Z-directional distances) from a top surface of the fin-type active region FA. Each of the first nanosheet N1, the second nanosheet N2, and the third nanosheet N3 included in the nanosheet stack NSS may have a channel region. As used herein, each of the first nanosheet N1, the second nanosheet N2, and the third nanosheet N3 may be referred to as a channel region.

In example embodiments, each of the first to third nanosheets N1, N2, and N3 may have a thickness selected in a range of about 4 nm to about 6 nm, without being limited thereto. Here, the thickness of each of the first to third nanosheets N1, N2, and N3 refers to a size of each of the first to third nanosheets N1, N2, and N3 in the vertical direction (Z direction). In example embodiments, the first to third nanosheets N1, N2, and N3 may have substantially the same thickness in the vertical direction (Z direction). In other example embodiments, at least some of the first to third nanosheets N1, N2, and N3 may have different thicknesses in the vertical direction (Z direction).

In example embodiments, at least some of the first to third nanosheets N1, N2, and N3 included in the nanosheet stack NSS may have different sizes in the first lateral direction (X direction). In other example embodiments, at least some of the first to third nanosheets N1, N2, and N3 may have the same size in the first lateral direction (X direction).

A pair of recesses R1 may be formed on both sides of the nanosheet stack NSS in the fin-type active region FA. As shown in FIG. 2A, lowermost surfaces of the pair of recesses R1 may be at a lower vertical level than the fin top surface FT of the fin-type active region FA. As used herein, the term "vertical level" refers to a height from a main surface 102M of the substrate 102 in a vertical direction (Z direction or –Z direction).

A pair of source/drain regions 130 may respectively be in the pair of recesses R1. The pair of source/drain regions 130 may be adjacent to the gate line 160. The pair of source/drain regions 130 may have sidewalls facing the first to third nanosheets N1, N2, and N3 included in the nanosheet stack NSS that is between the pair of source/drain regions 130. The pair of source/drain regions 130 may be each in contact with the first to third nanosheets N1, N2, and N3 included in the nanosheet stack NSS that is between the pair of source/drain regions 130.

In example embodiments, the transistor TR may be a PMOS transistor, and the pair of source/drain regions 130 may include a plurality of epitaxially grown SiGe layers. For example, the pair of source/drain regions 130 may each include a $Si_{1-x}Ge_x$ layer (here, $x \neq 0$) doped with a p-type dopant, and an atomic ratio of a Ge element may increase in a direction away from the lowermost surface of the recess R1 in the vertical direction (Z direction). The p-type dopant may include boron (B), gallium (Ga), carbon (C), or a combination thereof, without being limited thereto. In example embodiments, the pair of source/drain regions 130 may each include a $Si_{1-x}Ge_x$ layer (here, $0.01 \leq x \leq 0.70$) doped with a p-type dopant, without being limited thereto.

In other example embodiments, the transistor TR may be an NMOS transistor, and the pair of source/drain regions 130 may include an epitaxially grown Si layer or an epitaxially grown SiC layer. For example, the pair of source/drain regions 130 may each include a silicon (Si) layer doped with an n-type dopant, and the n-type dopant may include phosphorus (P), without being limited thereto.

In example embodiments, in the nanosheet stack NSS, the first nanosheet N1, the second nanosheet N2, and the third nanosheet N3 may include a semiconductor layer including the same element. In an example, each of the first nanosheet N1, the second nanosheet N2, and the third nanosheet N3 may include a Si layer. In example embodiments, each of the first nanosheet N1, the second nanosheet N2, and the third nanosheet N3 may include a Si layer doped with a dopant of the same conductivity type as that of the source/drain region 130. In an example, each of the first nanosheet N1, the second nanosheet N2, and the third nanosheet N3 may include a Si layer doped with a p-type dopant. In another example, each of the first nanosheet N1, the second nanosheet N2, and the third nanosheet N3 may include a Si layer doped with an n-type dopant. Examples of the p-type dopant and the n-type dopant may be the same as those described above. In still other example embodiments, each of the first nanosheet N1, the second nanosheet N2, and the third nanosheet N3 may include an undoped Si layer.

The gate line 160 may surround the first nanosheet N1, the second nanosheet N2, and the third nanosheet N3 on the fin-type active region FA and extend in the second lateral direction (Y direction). As shown in FIGS. 2A and 2C, the gate line 160 may include a main gate portion 160M and a plurality of sub-gate portions 160S. The main gate portion 160M may cover a top surface of the nanosheet stack NSS and extend in the second lateral direction (Y direction). The plurality of sub-gate portions 160S may be integrally connected to the main gate portion 160M and respectively arranged between the first to third nanosheets N1, N2, and N3 and between the first nanosheet N1 and the fin-type active region FA. In example embodiments, in the vertical direction (Z direction), a thickness of each of the plurality of sub-gate portions 160S may be less than a thickness of the main gate portion 160M. In other example embodiments, in the vertical direction (Z direction), the thickness of each of the plurality of sub-gate portions 160S may be substantially equal to the thickness of the main gate portion 160M.

The gate line 160 may include a metal, a metal nitride, a metal carbide, or a combination thereof. The metal may be selected from titanium (Ti), tungsten (W), ruthenium (Ru), niobium (Nb), molybdenum (Mo), hafnium (Hf), nickel (Ni), cobalt (Co), platinum (Pt), ytterbium (Yb), terbium (Tb), dysprosium (Dy), erbium (Er), and palladium (Pd). The metal nitride may be selected from titanium nitride (TiN) and tantalum nitride (TaN). The metal carbide may include titanium aluminum carbide (TiAlC). However, a material included in the gate line 160 is not limited to the examples described above.

The IC device 100 may include a gate dielectric film 150. The gate dielectric film 150 may include a first gate dielectric film 152 and a second gate dielectric film 154. The first gate dielectric film 152 may include portions between the sub-gate portion 160S included in the gate line 160 and each of the first nanosheet N1, the second nanosheet N2, and the third nanosheet N3 and portions between the sub-gate portion 160S included in the gate line 160 and the source/drain region 130. The second gate dielectric film 154 may include a portion in contact with a partial region of the first gate dielectric film 152.

The first gate dielectric film 152 may include portions (inclusively referred to as first portions), which are respectively in contact with the first nanosheet N1, the second nanosheet N2, and the third nanosheet N3, and portions (inclusively referred to as second portions), which are respectively apart from the first nanosheet N1, the second nanosheet N2, and the third nanosheet N3. The second gate dielectric film 154 may include portions (inclusively referred to as third portions), which are in contact with the first gate dielectric film 152 at a higher vertical level than a top surface of the main gate portion 160M included in the gate line 160, and a portion (inclusively referred to as a fourth portion), which is apart from each of the first nanosheet N1, the second nanosheet N2, and the third nanosheet N3 in the vertical direction (Z direction) and in contact with the top surface of the main gate portion 160M included in the gate line 160.

In example embodiments, the first gate dielectric film 152 may have a stack structure of an interface dielectric film and a high-k dielectric film. The interface dielectric film may include a low-k dielectric material film (e.g., a silicon oxide film, a silicon oxynitride film, or a combination thereof), which has a dielectric constant of about 9 or less. In example embodiments, the interface dielectric film may be omitted. As used herein, the high-k dielectric film included in the first gate dielectric film 152 may be referred to as a first high-k dielectric film. The first high-k dielectric film may include a high-k dielectric material having a higher dielectric constant than a silicon oxide film. The first high-k dielectric film may have a dielectric constant of about 10 to 25. The first gate dielectric film 152 may include a first high-k dielectric film including a metal oxide. The metal oxide may include at least one metal selected from hafnium (Hf), zirconium (Zr), aluminum (Al), niobium (Nb), cerium (Ce), lanthanum (La), tantalum (Ta), titanium (Ti), strontium (Sr), and barium (Ba). In example embodiments, the first high-k dielectric film may include hafnium oxide ($HfO_2$), hafnium silicon oxide (HfSiO), hafnium silicon oxynitride (HfSiON), hafnium oxynitride (HfON), hafnium aluminum oxide (HfAlO), hafnium lanthanum oxide (HfLaO), zirconium oxide ($ZrO_2$), zirconium silicon oxide (ZrSiO), hafnium zirconium oxide (HfZrO), aluminum oxide ($Al_2O_3$), lanthanum oxide ($La_2O_3$), lanthanum aluminum oxide (LaAlO), tantalum oxide (Ta$_2$O$_5$) titanium oxide (TiO$_2$), strontium titanium oxide (SrTiO), barium strontium titanium oxide (BaSrTiO), barium titanium oxide (BaTiO), yttrium oxide (Y$_2$O$_3$), lead scandium tantalum oxide (PbScTaO), lead zinc niobium oxide (PbZnNbO), lead zirconium titanium oxide (PbZrTiO), or a combination thereof, without being limited thereto. Here, the hafnium zirconium oxide may be a material obtained by doping zirconium (Zr) into hafnium oxide or a compound including hafnium (Hf), zirconium (Zr), and oxygen (O). For example, the first gate dielectric film 152 may include the first high-k dielectric film, which includes HfO$_2$, ZrO$_2$, Al$_2$O$_3$, La$_2$O$_3$, Ta$_2$O$_5$, TiO$_2$, SrTiO$_3$, BaSrTiO$_3$, or a combination thereof. The first high-k dielectric film constituting the first gate dielectric film 152 may have a single film layer including a single high-k dielectric film or a multilayered film structure including a plurality of different high-k dielectric films.

In example embodiments, the first gate dielectric film 152 may include a high-k dielectric film including no dipole dopant. The term "dipole dopant" used herein may refer to a material that may form a dipole in the gate dielectric film 150 to affect an effective work function of the gate dielectric film 150, thereby causing polarization in the gate dielectric film 150 to change energy band and change a threshold voltage of a transistor. A detailed description of the dipole dopant will be presented below with reference to FIGS. 3A and 3B.

The second gate dielectric film 154 may include a high-k dielectric film. As used herein, the high-k dielectric film included in the second gate dielectric film 154 may be referred to as a second high-k dielectric film. In example embodiments, the second gate dielectric film 154 may include the second high-k dielectric film, which includes the same composition as that of the first high-k dielectric film described above. For example, the first high-k dielectric film and the second high-k dielectric film may include the same high-k dielectric material as each other. In other example embodiments, the second gate dielectric film 154 may include a different constituent material from the first high-k dielectric film included in the first gate dielectric film 152. For example, the first high-k dielectric film and the second high-k dielectric film may include different high-k dielectric materials from each other. In example embodiments, the second gate dielectric film 154 may include a high-k dielectric film including no dipole dopant. Specific examples of the second high-k dielectric film may be the same as those of the first high-k dielectric film, which are described above.

In example embodiments, the second portions of the first gate dielectric film 152, which are respectively apart from the first nanosheet N1, the second nanosheet N2 and the third nanosheet N3, and the third portions of the second gate dielectric film 154, which are in contact with the first gate dielectric film 152, may each include a portion that extends in a direction away from the substrate 102 in the vertical direction (Z direction). In each portion where the first gate dielectric film 152 is in contact with the second gate dielectric film 154, an interface between the second portion of the first gate dielectric film 152 and the third portion of the second gate dielectric film 154 may extend in the vertical direction (Z direction).

The fourth portion of the second gate dielectric film 154, which is in contact with the top surface of the main gate portion 160M included in the gate line 160, may be apart from the first portions of the first gate dielectric film 152 with the gate line 160 therebetween along the vertical direction (Z direction).

In example embodiments, the first gate dielectric film 152 may be in contact with each of the first nanosheet N1, the second nanosheet N2 and the third nanosheet N3, which are included in the nanosheet stack NSS, and the second gate dielectric film 154 may be apart from each of the first nanosheet N1, the second nanosheet N2 and the third nanosheet N3, which are included in the nanosheet stack NSS, in the vertical direction (Z direction). In example embodiments, a lowermost surface of the second gate dielectric film 154 may be farther from the substrate 102 than uppermost surfaces of the pair of source/drain regions 130 in the vertical direction (Z direction).

The pair of source/drain regions 130 may be respectively on both sides of the gate line 160 with the gate line 160 therebetween. The pair of source/drain regions 130 may be each apart from each of the plurality of sub-gate portions 160S with the first gate dielectric film 152 therebetween. The pair of source/drain regions 130 may be each in contact with a portion of the first gate dielectric film 152, which covers a sidewall of each of the plurality of sub-gate portions 160S. The second gate dielectric film 154 may be at a vertical level, which is farther from the substrate 102 than a vertical level at which the pair of source/drain regions 130 are located.

As shown in FIGS. 2A and 2B, the gate line 160 may be covered by a capping insulating pattern 164. The fourth portion of the second gate dielectric film 154 may be between the gate line 160 and the capping insulating pattern 164. A bottom surface of the fourth portion of the second gate dielectric film 154 may be in contact with a top surface of the gate line 160, and a top surface of the fourth portion of the second gate dielectric film 154 may be in contact with a bottom surface of the capping insulating pattern 164. The capping insulating pattern 164 may cover the top surface of the gate line 160 with the fourth portion of the second gate dielectric film 154 therebetween. The capping insulating pattern 164 may be apart from the top surface of the gate line 160 in the vertical direction (Z direction). A bottom surface and both sidewalls of the capping insulating pattern 164 may be in contact with the second gate dielectric film 154. In example embodiments, the capping insulating pattern 164 may include a silicon nitride film, without being limited thereto.

As shown in FIGS. 2A and 2B, both sidewalls of the gate line 160 and both sidewalls of the capping insulating pattern 164 may be covered by insulating spacers 118. The insulating spacers 118 may cover both sidewalls of the main gate portion 160M and both sidewalls of the capping insulating pattern 164 on the top surface of the nanosheet stack NSS. The insulating spacers 118 may be apart from the main gate portion 160M of the gate line 160 with the first gate dielectric film 152 therebetween, and be apart from the capping insulating pattern 164 with the first gate dielectric film 152 and the second gate dielectric film 154 therebetween. Each of the second portion of the first gate dielectric film 152 and the third portion of the second gate dielectric film 154 may include a portion, which extends in the vertical direction (Z direction) in a direction away from the substrate 102 between the capping insulating pattern 164 and the insulating spacers 118. A thickness of each of the first gate dielectric film 152 and the second gate dielectric film 154 may be in a range of about 0.2 Å to about 30 Å, without being limited thereto.

In example embodiments, the insulating spacer 118 may include silicon nitride (SiN), silicon oxide (SiO), silicon carbonitride (SiCN), silicon boron nitride (SiBN), silicon oxynitride (SiON), silicon oxycarbonitride (SiOCN), silicon boron carbonitride (SiBCN), silicon oxycarbide (SiOC), or a combination thereof. As used herein, each of the terms "SiCN," "SiBN," "SiON," "SiOCN," "SiBCN," and "SiOC" refers to a material including elements included therein, without referring to a chemical formula representing a stoichiometric relationship.

As shown in FIG. 2A, the source/drain region 130 and the insulating spacers 118 may be covered by an insulating liner 142. The insulating liner 142 may include SiN, SiO, SiCN, SiBN, SiON, SiOCN, SiBCN, SiOC, or a combination thereof. An inter-gate dielectric film 144 may be on the insulating liner 142. The inter-gate dielectric film 144 may include a silicon nitride film, a silicon oxide film, SiON, SiOCN, or a combination thereof. In example embodiments, the insulating liner 142 may be omitted.

Figure 2D:
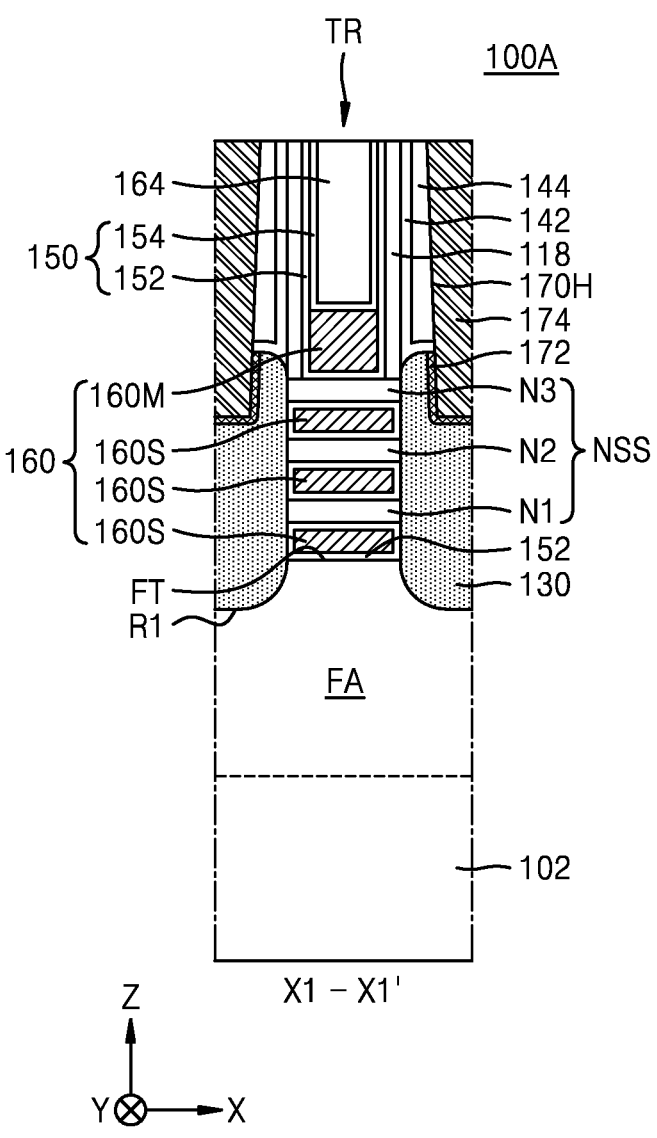
FIG. 2D is a cross-sectional view of an IC device according to example embodiments.

FIG. 2D is a cross-sectional view of an IC device 100A according to example embodiments. FIG. 2D illustrates a partial configuration of a portion corresponding to a cross-section taken along line X1-X1' of FIG. 1. In FIG. 2D, the same reference numerals are used to denote the same elements as in FIGS. 2A to 2C, and detailed descriptions thereof are omitted.

Referring to FIG. 2D, the IC device 100A may substantially have the same configuration as the IC device 100 described with reference to FIGS. 2A to 2C. However, the IC device 100A may include a pair of source/drain contacts 174 on the pair of source/drain regions 130.

The pair of source/drain contacts 174 may each extend in a direction away from the substrate 102 in a vertical direction (Z direction) on the source/drain region 130. A metal silicide film 172 may be between the source/drain region 130 and the source/drain contact 174.

The pair of source/drain contacts 174 may each fill a contact hole 170H, which passes through the inter-gate dielectric film 144 and the insulating liner 142 in the vertical direction (Z direction) and extends into the source/drain region 130. The source/drain region 130 may be apart from the source/drain contact 174 with the metal silicide film 172 therebetween. The source/drain region 130 may surround a lower portion of the source/drain contact 174 outside the contact hole 170H.

In example embodiments, the pair of source/drain contacts 174 may each include a metal, a conductive metal nitride, or a combination thereof. For example, the pair of source/drain contacts 174 may each include W, Cu, Al, Ti, Ta, TiN, TaN, an alloy thereof, or a combination thereof. In example embodiments, the metal silicide film 172 may include titanium silicide, without being limited thereto. In example embodiments, the metal silicide film 172 may be omitted.

Each of the IC devices 100 and 100A described with reference to FIGS. 1 and 2A to 2D may include a gate dielectric film 150 including a first gate dielectric film 152 and a second gate dielectric film 154. The first gate dielectric film 152 may be in contact with each of the first nanosheet N1, the second nanosheet N2 and the third nanosheet N3, and the second gate dielectric film 154 may be in contact with a partial region of the first gate dielectric film 152. The second gate dielectric film 154 may be effectively used to control a critical voltage of a transistor by changing an effective work function of the gate dielectric film 150 as needed. More specifically, the second gate dielectric film 154 may be connected to the partial region of the first gate dielectric film 152 and control the electrical properties of the gate dielectric film 150 along with the first gate dielectric film 152. Accordingly, a gate voltage applied to a channel region including the first nanosheet N1, the second nanosheet N2 and the third nanosheet N3, and a critical voltage of the transistor TR may be controlled by using the second gate dielectric film 154.

The second gate dielectric film 154 may be included in only some transistors selected from a plurality of transistors formed on the substrate 102. Because the second gate dielectric film 154 is partially apart from the first gate dielectric film 152 with the gate line 160 therebetween, when a process of removing an unnecessary portion of the second gate dielectric film 154 is performed to selectively form the second gate dielectric film 154 in only a partial region of the substrate 102, adverse effects may be prevented. For example, damage to the first gate dielectric film 152 located thereunder or other components may be prevented. Accordingly, the electrical properties of the gate dielectric film 150 may be prevented from deteriorating, and a degree of freedom for controlling a critical voltage of the transistor TR may be improved. Therefore, the gate dielectric film 150 including the first gate dielectric film 152 and the second gate dielectric film 154 having various structures that provide optimum work functions required by the transistor TR may be adopted. Thus, the transistor TR having a desired threshold voltage may be easily embodied with desired performance, and the reliability of the IC devices 100 and 100A may be improved.

Figure 3A:
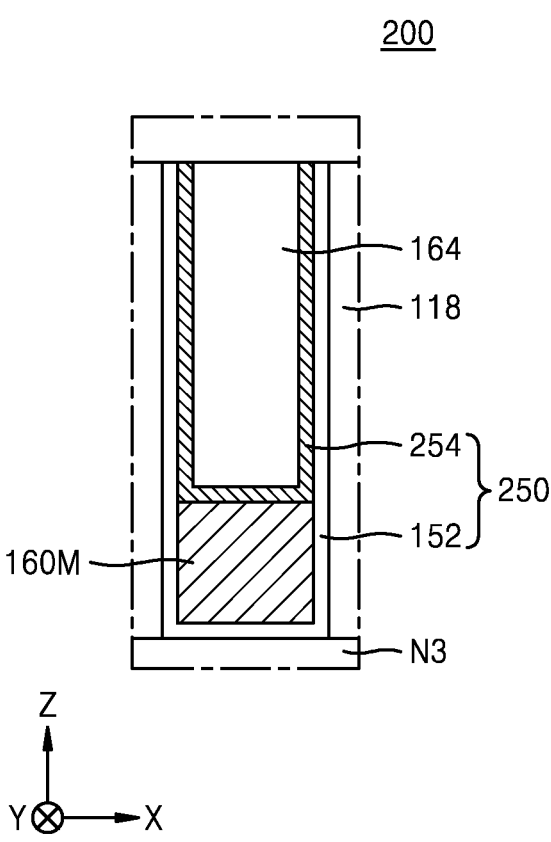
FIGS. 3A and 3B are cross-sectional views of an IC device according to example embodiments.
Figure 3B:
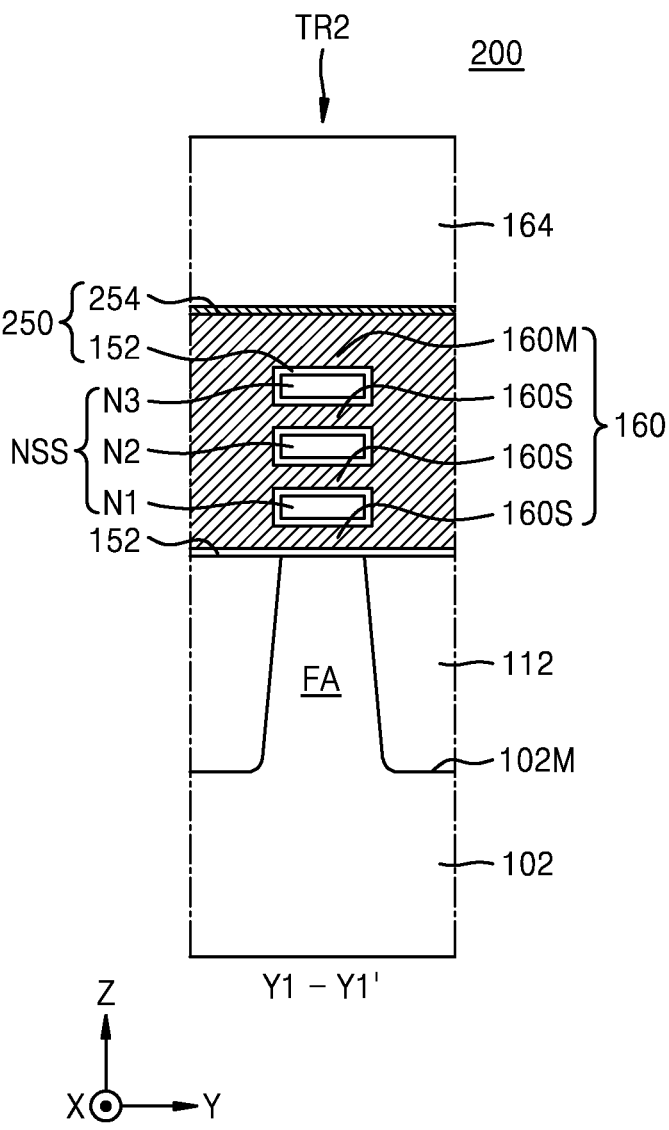

FIGS. 3A and 3B are diagrams of an IC device 200 according to example embodiments. Specifically, FIG. 3A is an enlarged cross-sectional view of a region corresponding to a local region "EX1" of FIG. 2A in the IC device 200. FIG. 3B is a cross-sectional view of some components in a portion corresponding to a cross-section taken along line Y1-Y1' of FIG. 1. In FIGS. 3A and 3B, the same reference numerals are used to denote the same elements as in FIGS. 2A to 2C, and detailed descriptions thereof are omitted.

Referring to FIGS. 3A and 3B, the IC device 200 may substantially have the same configuration as the IC device 100 described with reference to FIGS. 2A to 2C or the IC device 100A described with reference to FIG. 2D. However, the IC device 200 may include a gate dielectric film 250 including a first gate dielectric film 152 and a second gate dielectric film 254.

Details of the first gate dielectric film 152 are the same as those described with reference to FIGS. 2A to 2C. The second gate dielectric film 254 may substantially be the same as the second gate dielectric film 154 described with reference to FIGS. 2A to 2C. However, the second gate dielectric film 254 may include a second high-k dielectric film including a dipole dopant.

The dipole dopant included in the second gate dielectric film 254 may include lanthanum (La), aluminum (Al), yttrium (Y), titanium (Ti), magnesium (Mg), niobium (Nb), boron (B), gallium (Ga), indium (In), europium (Eu), dysprosium (Dy), holmium (Ho), ytterbium (Yb), or a combination thereof, without being limited thereto.

In example embodiments, the dipole dopant included in the second gate dielectric film 254 may include lanthanum (La) or aluminum (Al). When the dipole dopant included in the second gate dielectric film 254 is lanthanum (La) and the transistor TR2 including the gate dielectric film 250 is a PMOS transistor, the dipole dopant may act toward increasing a threshold voltage of the transistor TR2. When the dipole dopant included in the second gate dielectric film 254 is lanthanum (La) and the transistor TR2 including the gate dielectric film 250 is an NMOS transistor, the dipole dopant may act toward dropping the threshold voltage of the transistor TR2. When the dipole dopant included in the second gate dielectric film 254 is aluminum (Al) and the transistor TR2 including the gate dielectric film 250 is a PMOS transistor, the dipole dopant may act toward dropping the threshold voltage of the transistor TR2. When the dipole dopant included in the second gate dielectric film 254 is aluminum (Al) and the transistor TR2 including the gate dielectric film 250 is an NMOS transistor, the dipole dopant may act toward increasing the threshold voltage of the transistor TR2.

In example embodiments, the second gate dielectric film 254 may include the second high-k dielectric film including the dipole dopant, and the second high-k dielectric film may include at least one metal selected from hafnium (Hf), zirconium (Zr), aluminum (Al), niobium (Nb), cerium (Ce), lanthanum (La), tantalum (Ta), titanium (Ti), strontium (Sr), and barium (Ba) and a metal oxide including the dipole dopant. For example, the second gate dielectric film 254 may include hafnium oxide ($HfO_2$) including the dipole dopant, hafnium silicon oxide (HfSiO) including the dipole dopant, hafnium silicon oxynitride (HfSiON) including the dipole dopant, hafnium oxynitride (HfON) including the dipole dopant, hafnium aluminum oxide (HfAlO) including the dipole dopant, hafnium lanthanum oxide (HfLaO) including the dipole dopant, zirconium oxide ($ZrO_2$) including the dipole dopant, zirconium silicon oxide (ZrSiO) including the dipole dopant, hafnium zirconium oxide (HfZrO) including the dipole dopant, aluminum oxide ($Al_2O_3$) including the dipole dopant, lanthanum oxide ($La_2O_3$) including the dipole dopant, lanthanum aluminum oxide (LaAlO) including the dipole dopant, tantalum oxide ($Ta_2O_5$) including the dipole dopant, titanium oxide ($TiO_2$) including the dipole dopant, strontium titanium oxide (Sr-TiO) including the dipole dopant, barium strontium titanium oxide (BaSrTiO) including the dipole dopant, barium titanium oxide (BaTiO) including the dipole dopant, yttrium oxide ($Y_2O_3$) including the dipole dopant, lead scandium tantalum oxide (PbScTaO) including the dipole dopant, lead zinc niobium oxide (PbZnNbO) including the dipole dopant, lead zirconium titanium oxide (PbZrTiO), or a combination thereof, without being limited thereto. For example, the second gate dielectric film 254 may include a hafnium oxide film including the dipole dopant, a zirconium oxide film including the dipole dopant, an aluminum oxide film including the dipole dopant, a lanthanum oxide film including the dipole dopant, a tantalum oxide film including the dipole dopant, a titanium oxide film including the dipole dopant, a strontium titanium oxide film including the dipole dopant, a barium strontium titanium oxide film including the dipole dopant, or a combination thereof, without being limited thereto. The second gate dielectric film 254 may include a metal oxide film including a single dipole dopant or a metal oxide film including a plurality of dipole dopants. The second gate dielectric film 254 may have a single film structure having a single composition film or a multilayered film structure including a plurality of different composition films. A thickness of the second gate dielectric film 254 may be in a range of about 0.2 Å to about 30 Å, without being limited thereto.

Figure 4A:
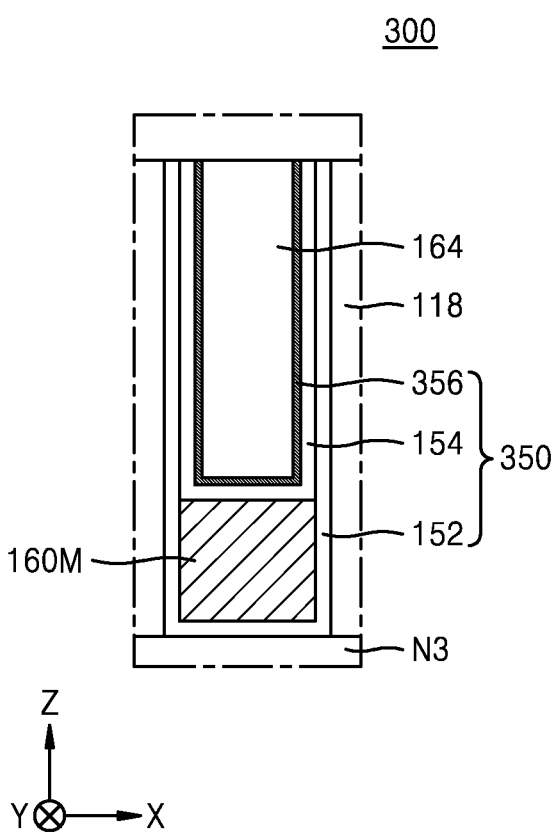
FIGS. 4A and 4B are cross-sectional views of an IC device according to example embodiments.
Figure 4B:
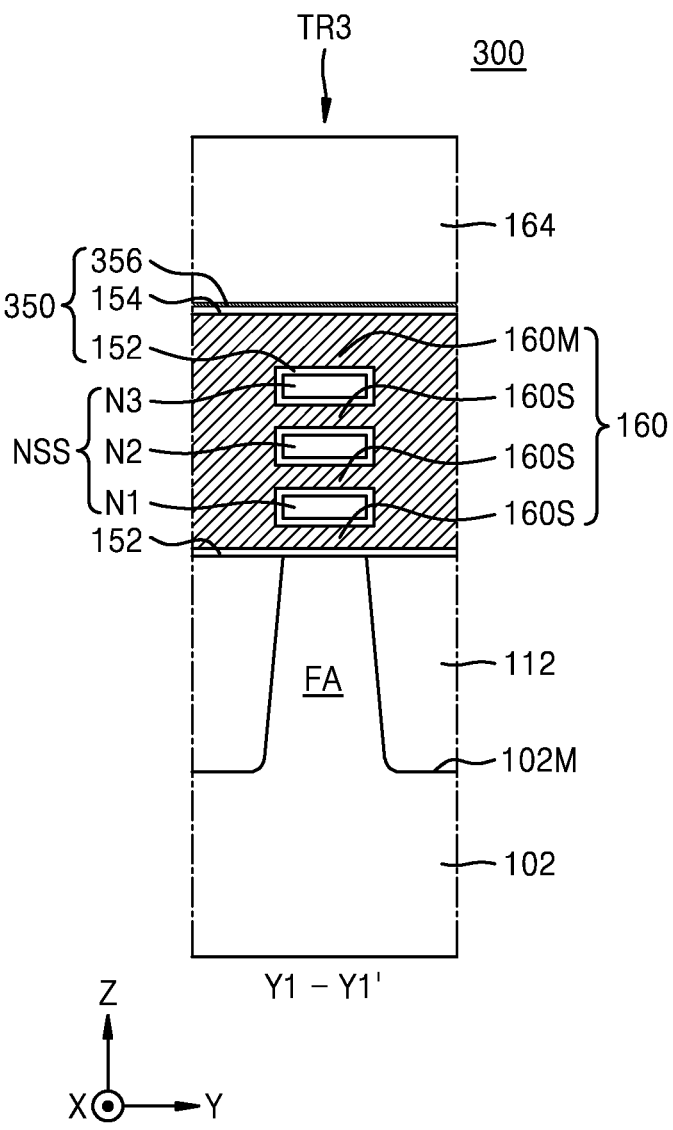

FIGS. 4A and 4B are diagrams of an IC device 300 according to example embodiments. FIG. 4A is an enlarged cross-sectional view of a region corresponding to a local region "EX1" of FIG. 2A in the IC device 300. FIG. 4B is a cross-sectional view of some components in a portion corresponding to a cross-section taken along line Y1-Y1' of FIG. 1. In FIGS. 4A and 4B, the same reference numerals are used to denote the same elements as in FIGS. 2A to 2C, and detailed descriptions thereof are omitted.

Referring to FIGS. 4A and 4B, the IC device 300 may substantially have the same configuration as the IC device 100 described with reference to FIGS. 2A to 2C or the IC device 100A described with reference to FIG. 2D. However, the IC device 300 may include a gate dielectric film 350 including a first gate dielectric film 152, a second gate dielectric film 154, and a dipole-inducing film 356.

Details of the first gate dielectric film 152 and the second gate dielectric film 154 may be the same as those described with reference to FIGS. 2A to 2C. The dipole-inducing film 356 may be apart from a gate line 160 and the first gate dielectric film 152 with the second gate dielectric film 154 therebetween.

The dipole-inducing film 356 may include a dipole-inducing element capable of forming a dipole in the gate dielectric film 350 to affect an effective work function of the gate dielectric film 350. The dipole-inducing element may include lanthanum (La), aluminum (Al), yttrium (Y), titanium (Ti), magnesium (Mg), niobium (Nb), boron (B), gallium (Ga), indium (In), europium (Eu), dysprosium (Dy), holmium (Ho), ytterbium (Yb), or a combination thereof, without being limited thereto. The dipole-inducing film 356 may include an oxide of the dipole-inducing element, a nitride of the dipole-inducing element, or a combination thereof.

In example embodiments, the dipole-inducing film 356 may include a La-containing film, an Al-containing film, or a combination thereof. The La-containing film may include lanthanum oxide ($La_2O_3$), lanthanum nitride (LaN), or a combination thereof. The Al-containing film may include aluminum oxide ($Al_2O_3$), aluminum nitride (AlN), or a combination thereof. A thickness of the dipole-inducing film 356 may be in a range of about 0.2 Å to about 30 Å, without being limited thereto.

In example embodiments, the dipole-inducing element included in the dipole-inducing film 356 may include lanthanum (La) or aluminum (Al). In example embodiments, when the dipole-inducing element included in the dipole-inducing film 356 is lanthanum (La) and transistor TR3 including the gate dielectric film 350 is a PMOS transistor, the dipole-inducing film 356 may contribute to increasing a threshold voltage of the transistor TR3. When the dipole-inducing element included in the dipole-inducing film 356 is lanthanum (La) and the transistor TR3 including the gate dielectric film 350 is an NMOS transistor, the dipole-inducing film 356 may contribute to dropping a threshold voltage of the transistor TR3. When the dipole-inducing element included in the dipole-inducing film 356 is aluminum (Al) and the transistor TR3 including the gate dielectric film 350 is a PMOS transistor, the dipole-inducing film 356 may contribute to dropping a threshold voltage of the transistor TR3. When the dipole-inducing element included in the dipole-inducing film 356 is aluminum (Al) and the transistor TR3 including the gate dielectric film 350 is an NMOS transistor, the dipole-inducing film 356 may contribute to increasing a threshold voltage of the transistor TR3.

Figure 5:
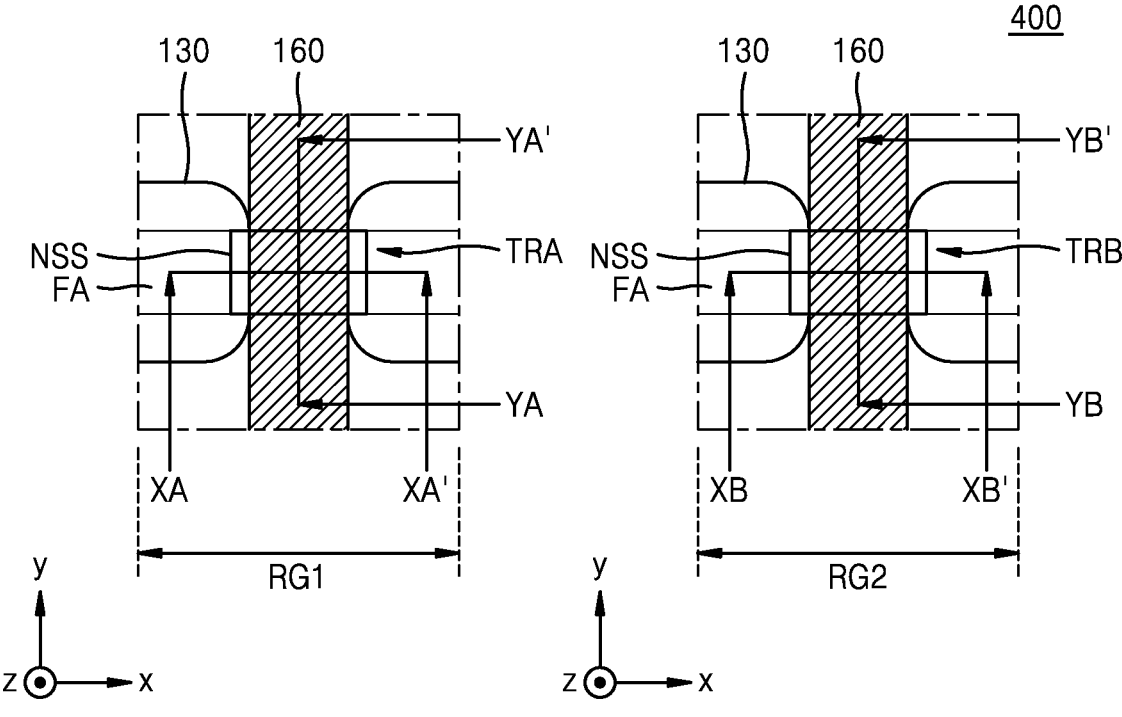
FIG. 5 is a plan layout diagram of some components of an IC device according to example embodiments.

FIG. 5 is a plan layout diagram of some components of an IC device 400 according to example embodiments.

Referring to FIG. 5, the IC device 400 may include a first region RG1 and a second region RG2. The first region RG1 and the second region RG2 may be regions that are adjacent to each other or apart from each other.

The fin-type active region FA may extend in a first lateral direction (X direction) in each of the first region RG1 and the second region RG2, and the gate line 160 may extend in a second lateral direction (Y direction) on the fin-type active region FA. Example embodiments are not limited thereto, and the fin-type active region FA and the gate line 160 in the first region RG1 may extend in a direction different from the fin-type active region FA in the second region RG2.

A first transistor TRA may be formed in a region where the fin-type active region FA intersects with the gate line 160 in the first region RG1, and a second transistor TRB may be formed in a region where the fin-type active region FA intersects with the gate line 160 in the second region RG2.

The first transistor TRA and the second transistor TRB may have different threshold voltages from each other. Each of the first transistor TRA and the second transistor TRB may be an NMOS transistor or a PMOS transistor. In example embodiments, the first transistor TRA and the second transistor TRB may be NMOS transistors having different threshold voltages from each other. In other example embodiments, the first transistor TRA and the second transistor TRB may be PMOS transistors having different threshold voltages from each other. In still other example embodiments, one of the first transistor TRA and the second transistor TRB may be an NMOS transistor, and the other of the first transistor TRA and the second transistor TRB may be a PMOS transistor.

Each of the first transistor TRA and the second transistor TRB may have one of the structures of the transistor TR shown in FIGS. 2A to 2D, the transistor TR2 shown in FIGS. 3A and 3B, the transistor TR3 shown in FIGS. 4A and 4B, or structures that are variously modified and changed within the scope thereof.

Figure 6A:
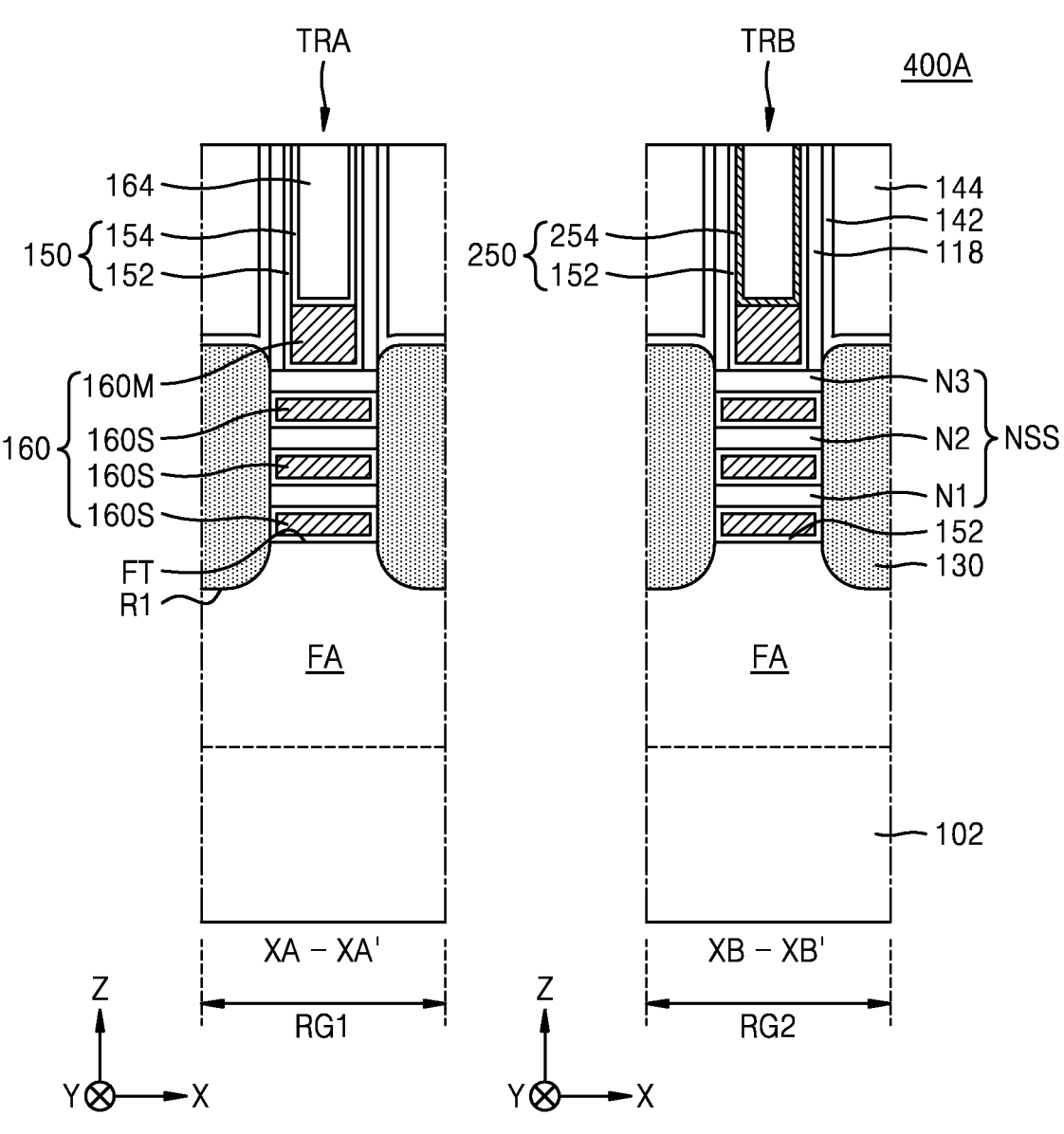
FIGS. 6A and 6B are cross-sectional views of an IC device according to example embodiments.
Figure 6B:
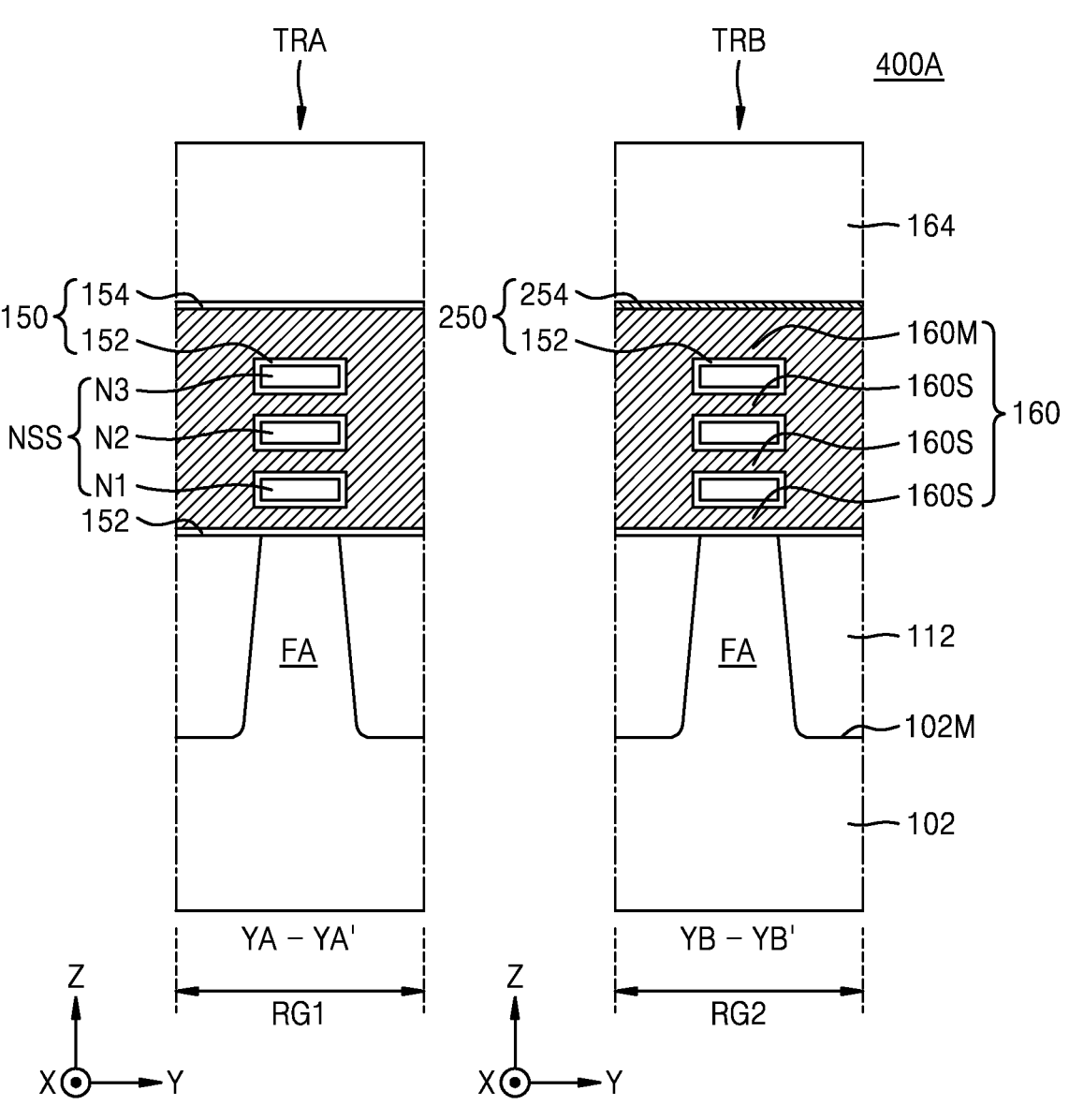

FIGS. 6A and 6B are each a cross-sectional view of an IC device 400A according to example embodiments. FIG. 6A illustrates some components in portions corresponding to cross-sections taken along lines XA-XA' and XB-XB' of FIG. 5. FIG. 6B illustrates some components in portions corresponding to cross-sections taken along lines YA-YA' and YB-YB' of FIG. 5. In FIGS. 6A and 6B, the same reference numerals are used to denote the same elements as in FIGS. 1, 2A to 2C, and 5, and detailed descriptions thereof are omitted.

Referring to FIGS. 6A and 6B, the IC device 400A may have the same plan layout as that of the IC device 400 described with reference to FIG. 5. In the IC device 400A, a first transistor TRA may be formed in a first region RG1 of a substrate 102, and a second transistor TRB may be formed in a second region RG2 of the substrate 102. The first transistor TRA may have the same structure as that of the transistor TR described with reference to FIGS. 2A to 2D. The second transistor TRB may have the same structure as that of the transistor TR2 described with reference to FIGS. 3A and 3B.

The substrate 102 may further include a third region, and a third transistor having the same structure as the transistor TR3 described with reference to FIGS. 4A and 4B may be formed in the third region. The third region may be a region adjacent to at least one of the first region RG1 and the second region RG2 or a region apart from the first region RG1 and the second region RG2.

Figure 7A:
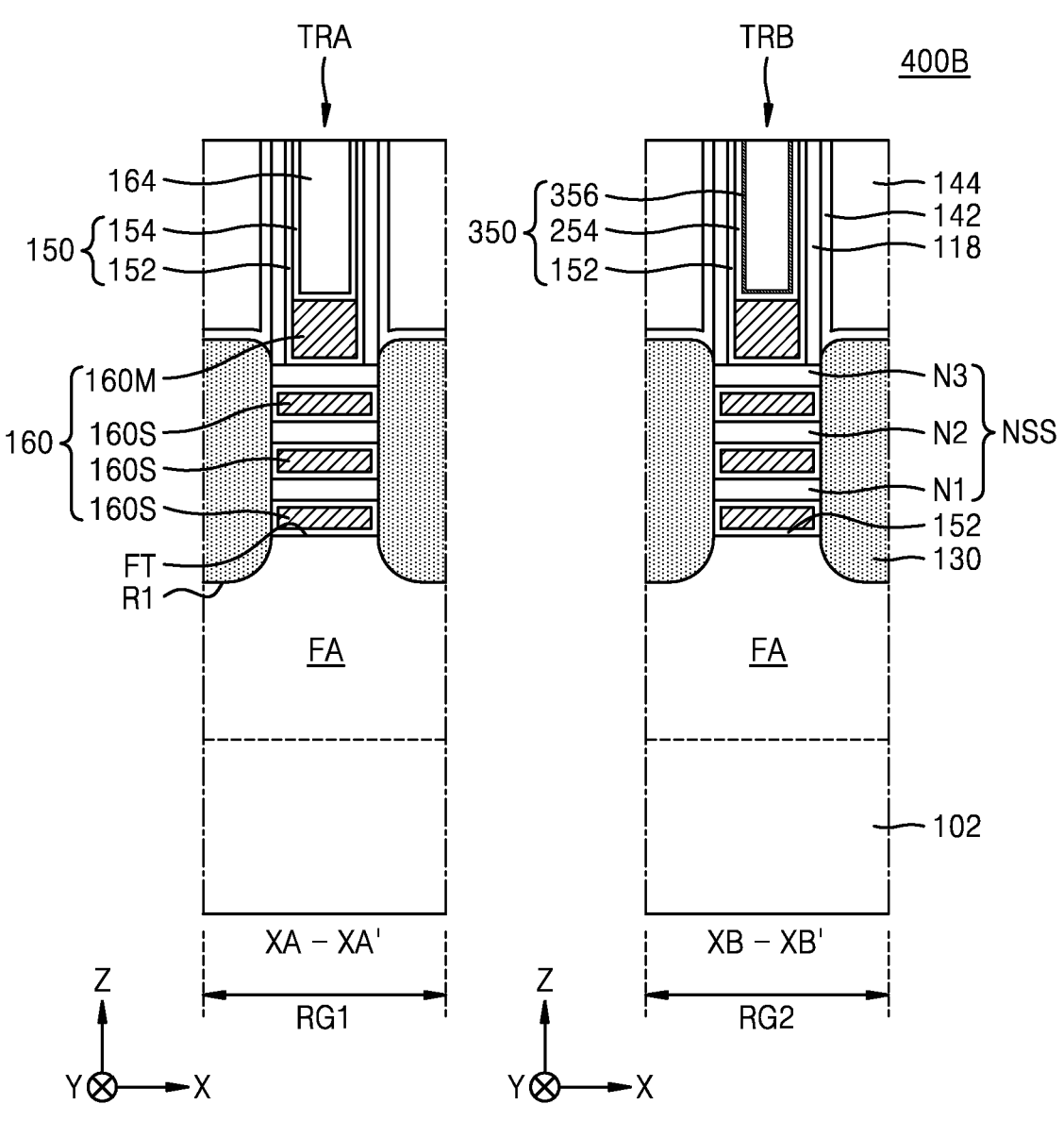
FIGS. 7A and 7B are cross-sectional views of an IC device according to example embodiments.
Figure 7B:
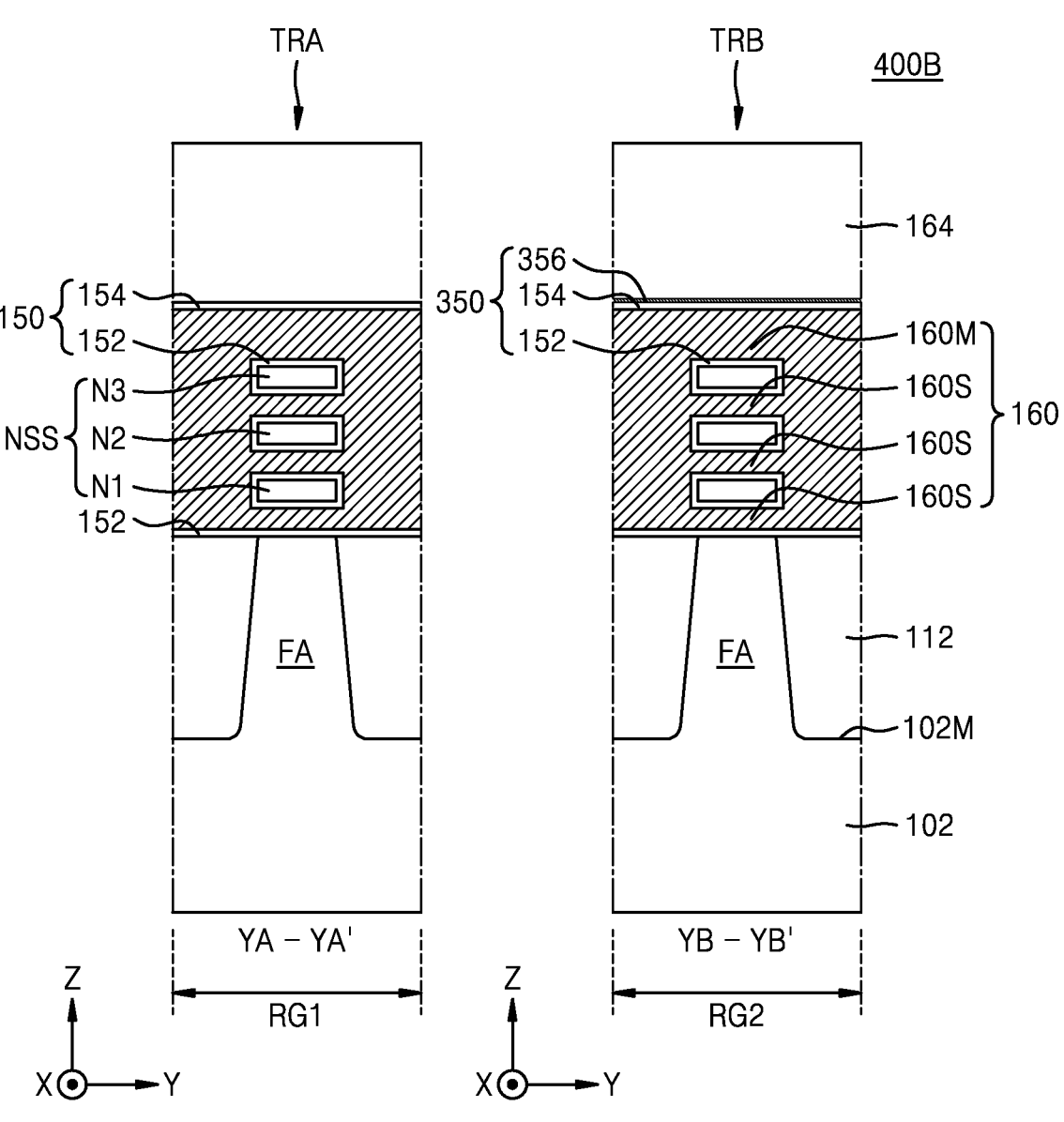

FIGS. 7A and 7B are each a cross-sectional view of an IC device 400B according to example embodiments. FIG. 7A illustrates some components in portions corresponding to the cross-sections taken along lines XA-XA' and XB-XB' of FIG. 5. FIG. 7B illustrates some components in portions corresponding to cross-sections taken along lines YA-YA' and YB-YB' of FIG. 5. In FIGS. 7A and 7B, the same reference numerals are used to denote the same elements as in FIGS. 1, 2A to 2C, and 5, and detailed descriptions thereof are omitted.

Referring to FIGS. 7A and 7B, the IC device 400B may have the same plan layout as that of the IC device 400 described with reference to FIG. 5. In the IC device 400B, a first transistor TRA may be formed in a first region RG1 of a substrate 102, and a second transistor TRB may be formed in a second region RG2 of the substrate 102. The first transistor TRA may have the same structure as that of the transistor TR described with reference to FIGS. 2A to 2D. The second transistor TRB may have the same structure as that of the transistor TR3 described with reference to FIGS. 4A and 4B.

In other example embodiments, the first transistor TRA may have the same structure as the transistor TR2 described with reference to FIGS. 3A and 3B.

Each of the IC devices 200, 300, 400, 400A, and 400B shown in FIGS. 3A to 7B may include a gate dielectric film 250 or 350 including a first gate dielectric film 152 and a second gate dielectric film 154 or 254. The first gate dielectric film 152 may be in contact with each of the first nanosheet N1, the second nanosheet N2, and the third nanosheet N3. The second gate dielectric film 154 or 254 may be in contact with a partial region of the first gate dielectric film 152. The IC device 300 may further include a dipole-inducing film 356 covering the second gate dielectric film 154. In the IC devices 200, 300, 400, 400A, and 400B, the second gate dielectric film 154 or 254 and/or the dipole-inducing film 356 may be effectively used to control a critical voltage of a transistor by changing an effective work function of the gate dielectric film 250 or 350 as needed.

The second gate dielectric film 154 or 254 and the dipole-inducing film 356 may be included in only some transistors selected from a plurality of transistors formed on the substrate 102. Because the second gate dielectric film 154 or 254 and the dipole-inducing film 356 are partially apart from the first gate dielectric film 152 with the gate line 160 therebetween, when a process of removing unnecessary portions of the second gate dielectric film 154 or 254 and/or the dipole-inducing film 356 is performed to selectively form the second gate dielectric film 154 or 254 and/or the dipole-inducing film 356 in only a partial region of the substrate 102, adverse effects may be prevented. For example, damage to the first gate dielectric film 152 located thereunder or other components may be prevented. Accordingly, the electrical properties of the gate dielectric film 250 or 350 may be prevented from deteriorating, and a degree of freedom for controlling a critical voltage of the transistor TR2 or TR3 may be improved. Therefore, the gate dielectric film 250 or 350 including the first gate dielectric film 152, the second gate dielectric film 154 or 254, and/or the dipole-inducing film 356 having various structures that provide optimum work functions required by the transistor TR2 or TR3 may be adopted. Thus, the transistor TR2 or TR3 having a desired threshold voltage may be easily embodied with desired performance, and the reliability of the IC devices 200, 300, 400, 400A, and 400B may be improved.

Figure 8:
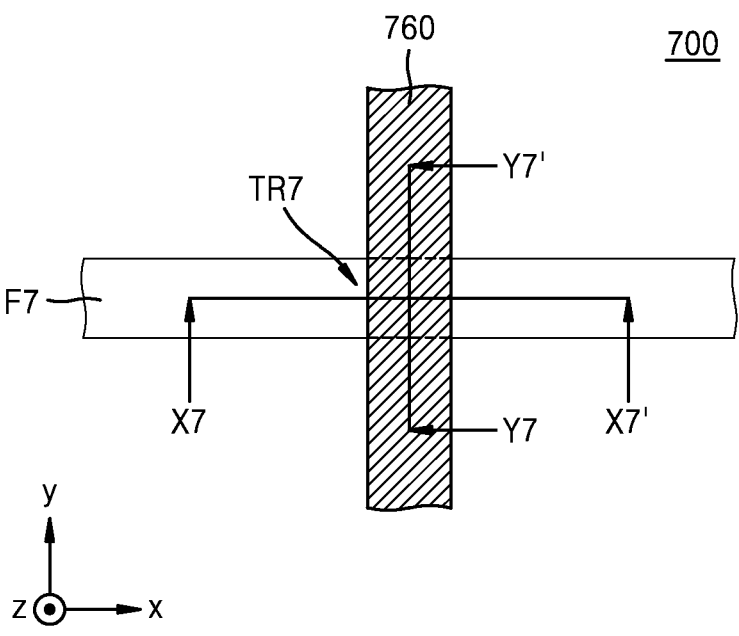
FIG. 8 is a plan layout diagram of some components of an IC device according to example embodiments.
Figure 9A:
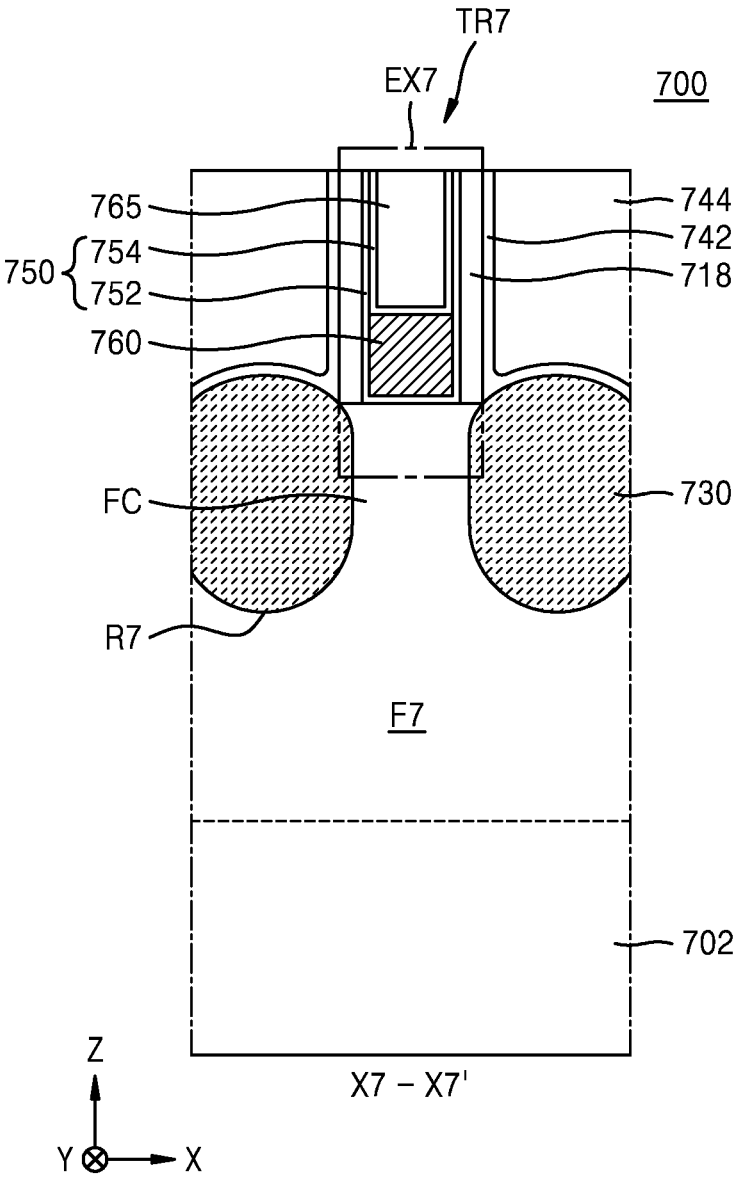
FIG. 9A is a cross-sectional view of some components corresponding to a cross-section taken along line X7-X7' of FIG. 8.
Figure 9B:
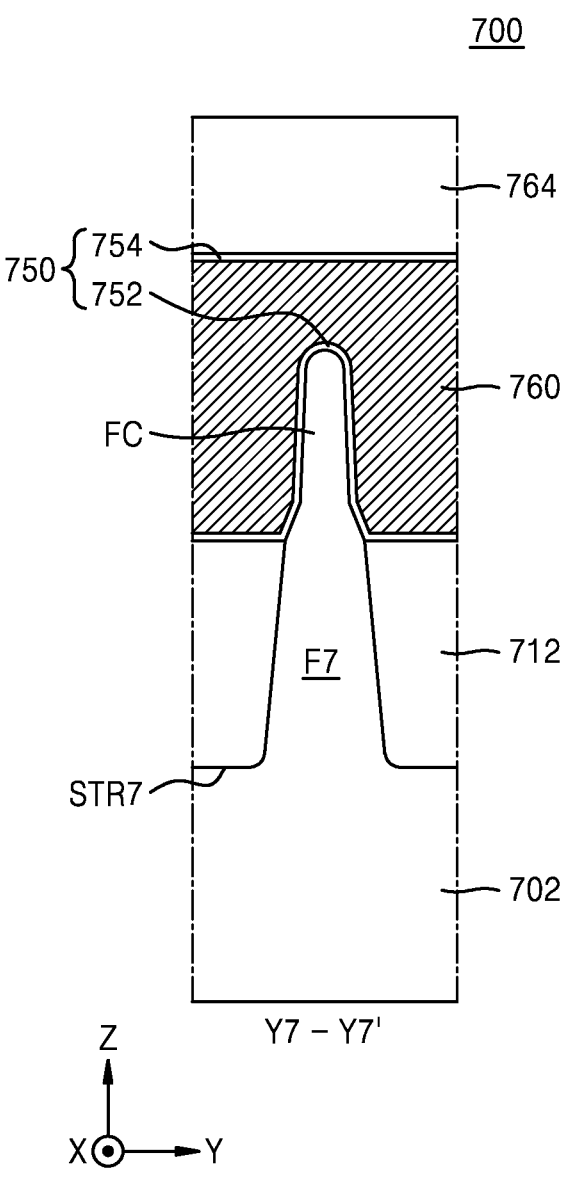
FIG. 9B is a cross-sectional view of some components corresponding to a cross-section taken along line Y7-Y7' of FIG. 8.
Figure 9C:
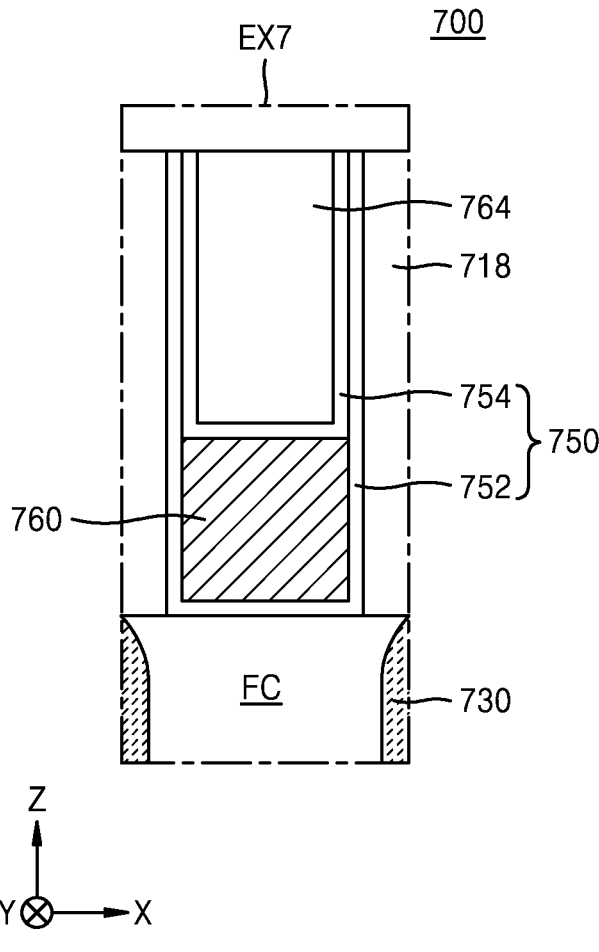
FIG. 9C is an enlarged cross-sectional view of a local region "EX7" of FIG. 9A.

FIG. 8 is a plan layout diagram of some components of an IC device 700 according to example embodiments. FIG. 9A is a cross-sectional view of some components corresponding to a cross-section taken along line X7-X7' of FIG. 8. FIG. 9B is a cross-sectional view of some components corresponding to a cross-section taken along line Y7-Y7' of FIG. 8. FIG. 9C is an enlarged cross-sectional view of a local region "EX7" of FIG. 9A.

Referring to FIGS. 8 and 9A to 9C, the IC device 700 may include a fin-type active region F7, which protrudes from a substrate 702 in a vertical direction (Z direction). The fin-type active region F7 may extend in a first lateral direction (X direction). The fin-type active region F7 may be defined by a device isolation trench STR7 formed in the substrate 702. The device isolation trench STR7 may be filled by a device isolation film 712. Both sidewalls of the fin-type active region F7 may be covered by the device isolation film 712.

Details of the substrate 702, the fin-type active region F7, and the device isolation film 712 may substantially be the same as those of the substrate 102, the fin-type active region FA, and the device isolation film 112, which are described with reference to FIGS. 1 and 2A to 2C.

A fin channel region FC protruding above the device isolation film 712 may be on the fin-type active region F7. The fin channel region FC may be integrally formed with the fin-type active region F7. As used herein, the fin channel region FC may be referred to as a channel region.

As shown in FIGS. 9A and 9B, on the fin-type active region F7 and the device isolation film 712, a gate line 760 may surround the fin channel region FC and extend in a second lateral direction (Y direction). As shown in FIG. 9B, the device isolation film 712 may be between the substrate 702 and the gate line 760.

As shown in FIG. 9A, a pair of recesses R7 may be formed on both sides of the fin channel region FC. The pair of recesses R7 may be filled with a pair of source/drain regions 730.

Respective constituent materials of the fin channel region FC, the gate line 760, and the source/drain region 730 may substantially be the same as those of the nanosheet stack NSS including the first to third nanosheets N1, N2, and N3, the gate line 160, and the source/drain region 130, which are described with reference to FIGS. 2A to 2C

A transistor TR7 may be formed in a portion where the fin-type active region F7 intersects with the gate line 760. The transistor TR7 may be an NMOS transistor or a PMOS transistor.

The transistor TR7 may include a gate dielectric film 750. The gate dielectric film 750 may include a first gate dielectric film 752 and a second gate dielectric film 754. The first gate dielectric film 752 may be between the fin channel region FC and the gate line 760. The first gate dielectric film 752 may include a portion in contact with a surface of the fin channel region FC, portions covering sidewalls of the gate line 760, and portions between a top surface of the device isolation film 712 and a bottom surface of the gate line 760. The second gate dielectric film 754 may include portions in contact with the first gate dielectric film 752 at a higher vertical level than a top surface of the gate line 760, and a portion that is apart from the fin channel region FC in the vertical direction (Z direction) and in contact with the top surface of the gate line 760. Details of the first gate dielectric film 752 and the second gate dielectric film 754 may substantially be the same as those of the first gate dielectric film 152 and the second gate dielectric film 254, which are described with reference to FIGS. 2A to 2C.

The gate line 760 may be covered by a capping insulating pattern 764. The second gate dielectric film 754 may be between the gate line 760 and the capping insulating pattern 764. The capping insulating pattern 764 may cover the top surface of the gate line 760 with a portion of the second gate dielectric film 754 therebetween. The capping insulating pattern 764 may be apart from the top surface of the gate line 760 in the vertical direction (Z direction). A bottom surface and both sidewalls of the capping insulating pattern 764 may be in contact with the second gate dielectric film 754.

As shown in FIG. 9A, both sidewalls of the gate line 760 and the both sidewalls of the capping insulating pattern 764 may be covered by insulating spacers 718. The insulating spacers 718 may be apart from the gate line 760 with the first gate dielectric film 752 therebetween and be apart from the capping insulating pattern 764 with the first gate dielectric film 752 and the second gate dielectric film 754 therebetween. A portion of the first gate dielectric film 752 and a portion of the second gate dielectric film 754 may extend in a direction away from the substrate 702 in the vertical direction (Z direction) while being in contact with each other between the capping insulating pattern 764 and the insulating spacers 718. A partial surface of each of the source/drain regions 730 may be covered by an insulating liner 742. The insulating liner 742 may be covered by an inter-gate dielectric film 744. Respective constituent materials of the insulating spacers 718, the insulating liner 742, the inter-gate dielectric film 744, and the capping insulating pattern 764 may substantially be the same as those of the insulating spacers 118, the insulating liner 142, the inter-gate dielectric film 144, and the capping insulating pattern 164, which are described with reference to FIGS. 2A to 2C.

Additionally, in the IC device 700, a source/drain contact substantially having the same structure as the source/drain contact 174 described with reference to FIG. 2D may be on the source/drain region 730.

Figure 10:
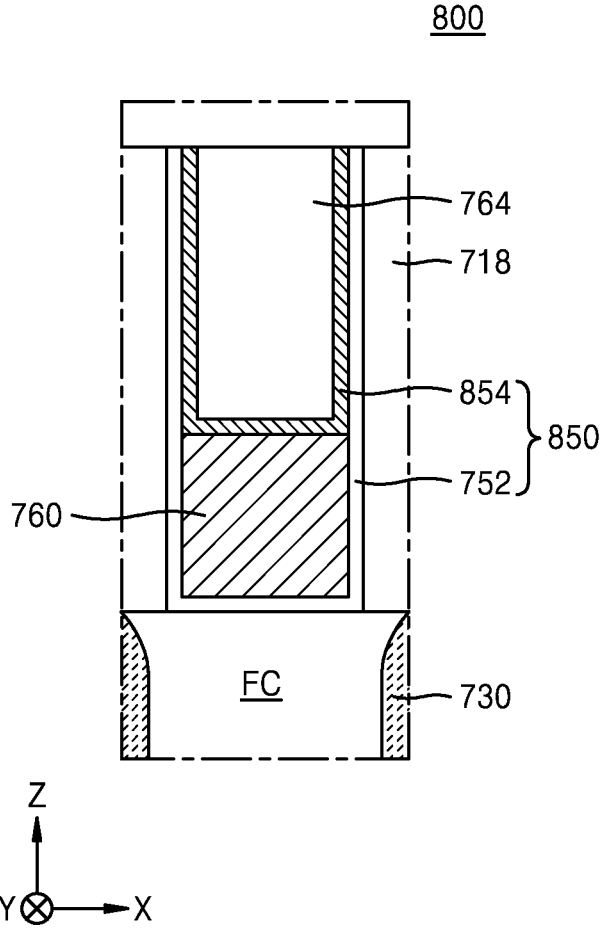
FIG. 10 is a cross-sectional view of an IC device according to example embodiments.

FIG. 10 is a cross-sectional view of an IC device 800 according to example embodiments. FIG. 10 illustrates an enlarged cross-sectional configuration of a region corresponding to a local region "EX7" of FIG. 9A. In FIG. 10, the same reference numerals are used to denote the same elements as in FIGS. 9A to 9C, and detailed descriptions thereof are omitted.

Referring to FIG. 10, the IC device 800 may substantially have the same configuration as the IC device 700 described with reference to FIGS. 9A to 9C. However, the IC device 800 may include a gate dielectric film 850, which includes a first gate dielectric film 752 and a second gate dielectric film 854. Details of the first gate dielectric film 752 may be the same as those described with reference to FIGS. 9A to 9C. The second gate dielectric film 854 may be the same as the second gate dielectric film 254 described with reference to FIGS. 3A and 3B.

Figure 11:
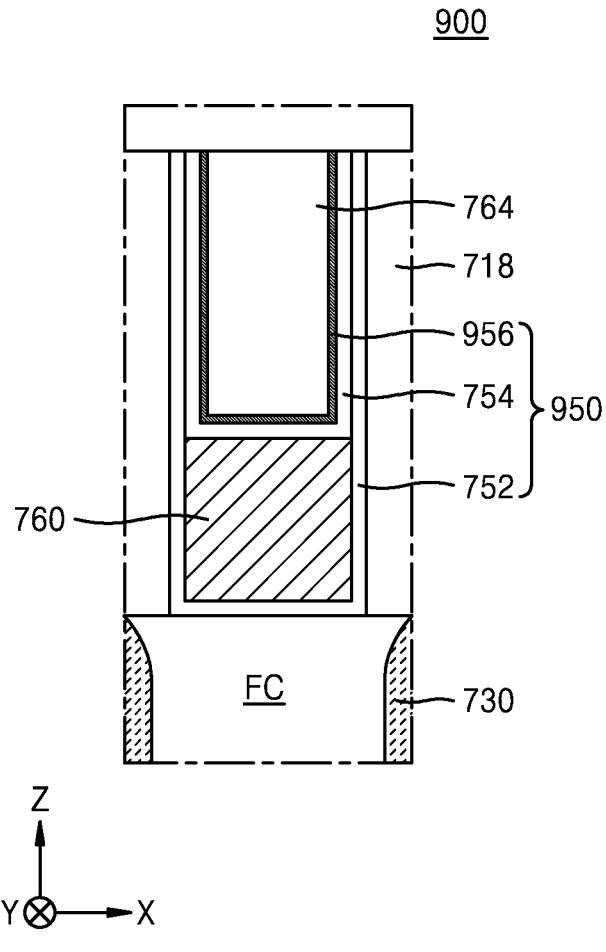
FIG. 11 is a cross-sectional view of an IC device according to example embodiments.

FIG. 11 is a cross-sectional view of an IC device 900 according to example embodiments. FIG. 11 illustrates an enlarged cross-sectional configuration of a region corresponding to the local region "EX7" of FIG. 9A. In FIG. 11, the same reference numerals are used to denote the same elements as in FIGS. 9A to 9C, and detailed descriptions thereof are omitted.

Referring to FIG. 11, the IC device 900 may substantially have the same configuration as the IC device 700 described with reference to FIGS. 9A to 9C. However, the IC device 900 may include a gate dielectric film 950, which includes a first gate dielectric film 752, a second gate dielectric film 754, and a dipole-inducing film 956. Details of the first gate dielectric film 752 and the second gate dielectric film 754 may be the same as those described with reference to FIGS. 9A to 9C. The dipole-inducing film 956 may be the same as the dipole-inducing film 356 described with reference to FIGS. 4A and 4B.

Each of the IC devices 700, 800, and 900 shown in FIGS. 8 to 11 may include the first gate dielectric film 752 in contact with the fin channel region FC and the gate dielectric film 750, 850, or 950 including the second gate dielectric film 754 or 854 in contact with a partial region of the first gate dielectric film 752. The IC device 900 may further include the dipole-inducing film 956 covering the second gate dielectric film 754. In the IC devices 700, 800, and 900, the second gate dielectric film 754 or 854 and/or the dipole-inducing film 956 may be effectively used to control a critical voltage of a transistor by changing an effective work function of the gate dielectric film 750, 850, or 950 as needed.

The second gate dielectric film 754 or 854 and the dipole-inducing film 956 may be included in only some transistors selected from a plurality of transistors formed on the substrate 702. Because the second gate dielectric film 754 or 854 and the dipole-inducing film 956 are partially apart from the first gate dielectric film 752 with the gate line 760 therebetween, when a process of removing unnecessary portions of the second gate dielectric film 754 or 854 and/or the dipole-inducing film 956 is performed to selectively form the second gate dielectric film 754 or 854 and/or the dipole-inducing film 956 in only a partial region of the substrate 702, adverse effects may be prevented. For example, damage to the first gate dielectric film 752 located thereunder or other components may be prevented. Accordingly, the electrical properties of the gate dielectric films 750, 850, and 950 may be prevented from deteriorating, and a degree of freedom for controlling critical voltages of transistors including the gate dielectric films 750, 850, and 950 may be improved. Therefore, transistors, which may have optimum work functions required by transistors formed on the substrate 702 and desired threshold voltages, may be easily embodied with desired performance, and the reliability of the IC devices 700, 800, and 900 may be improved.

FIGS. 12A to 12L are diagrams of a process sequence of a method of manufacturing an IC device, according to example embodiments. An example of a method of manufacturing the IC device 100 shown in FIGS. 1 and 2A to 2C is described with reference to FIGS. 12A to 12L. In FIGS. 12A to 12L, the same reference numerals are used to denote the same elements as in FIGS. 1 and 2A to 2C, and detailed descriptions thereof are omitted.

Figure 12A:
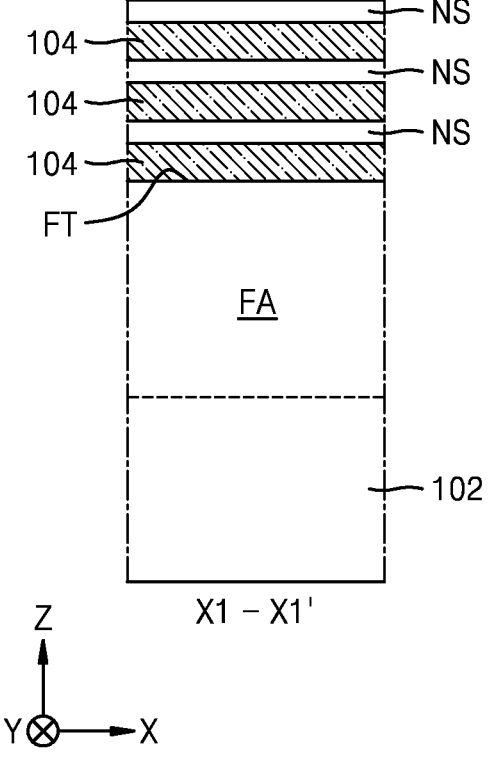
FIGS. 12A, 12B, 12C, 12D, 12E, 12F, 12G, 12H, 12I, 12J, 12K and 12L are diagrams of a process sequence of a method of manufacturing an IC device, according to example embodiments.

Referring to FIG. 12A, a plurality of sacrificial semiconductor layers 104 and a plurality of nanosheet semiconductor layers NS may be alternately stacked one-by-one on a substrate 102. Thereafter, portions of the plurality of sacrificial semiconductor layers 104, the plurality of nanosheet semiconductor layers NS, and the substrate 102 may be etched to define a plurality of fin-type active regions FA in the substrate 102. Thereafter, a device isolation film (refer to 112 in FIG. 2C) may be formed to cover sidewalls of each of the plurality of fin-type active regions FA.

The stack structure of the plurality of sacrificial semiconductor layers 104 and the plurality of nanosheet semiconductor layers NS may remain on the fin top surface FT of each of the plurality of fin-type active regions FA.

The plurality of sacrificial semiconductor layers 104 and the plurality of nanosheet semiconductor layers NS may include semiconductor materials having different etch selectivities. In example embodiments, the plurality of nanosheet semiconductor layers NS may include a silicon (Si) layer, and the plurality of sacrificial semiconductor layers 104 may include a silicon germanium (SiGe) layer. In example embodiments, the plurality of sacrificial semiconductor layers 104 may have a constant Ge content. The SiGe layer included in the plurality of sacrificial semiconductor layers 104 may have a constant Ge content, which is selected in a range of about 5 at % to about 60 at %, for example, about 10 at % to about 40 at %. The Ge content of the SiGe layer included in the plurality of sacrificial semiconductor layers 104 may be variously selected as needed.

Figure 12B:
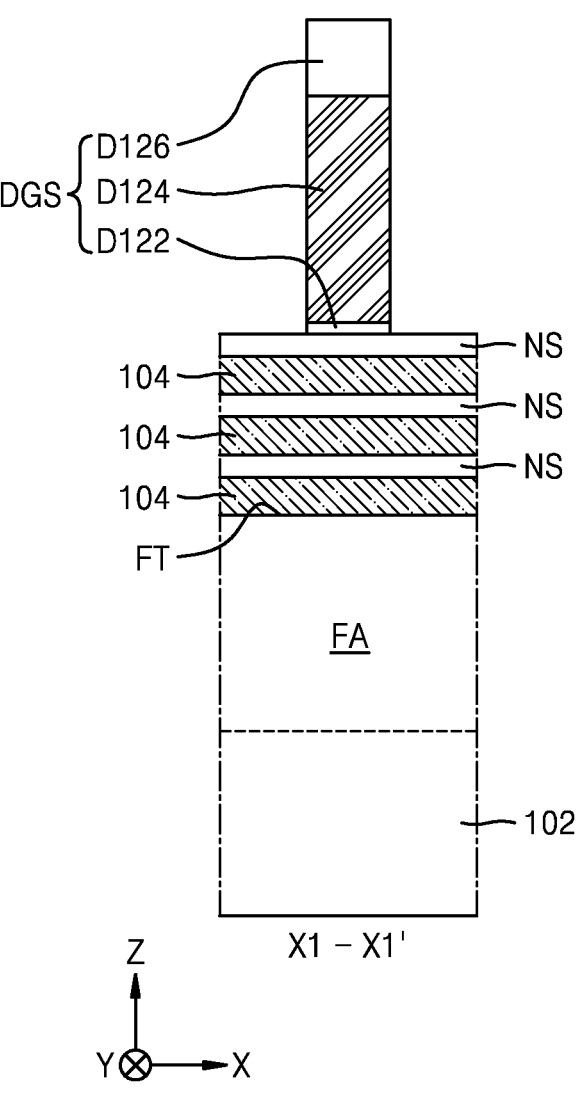

Referring to FIG. 12B, a dummy gate structure DGS may be formed on the stack structure of the plurality of sacrificial semiconductor layers 104 and the plurality of nanosheet semiconductor layers NS.

The dummy gate structure DGS may be formed to extend in a second lateral direction (Y direction). The dummy gate structure DGS may have a structure in which an oxide film D122, a dummy gate layer D124, and a capping layer D126 are sequentially stacked. In example embodiments, the dummy gate layer D124 may include polysilicon, and the capping layer D126 may include a silicon nitride film.

Figure 12C:
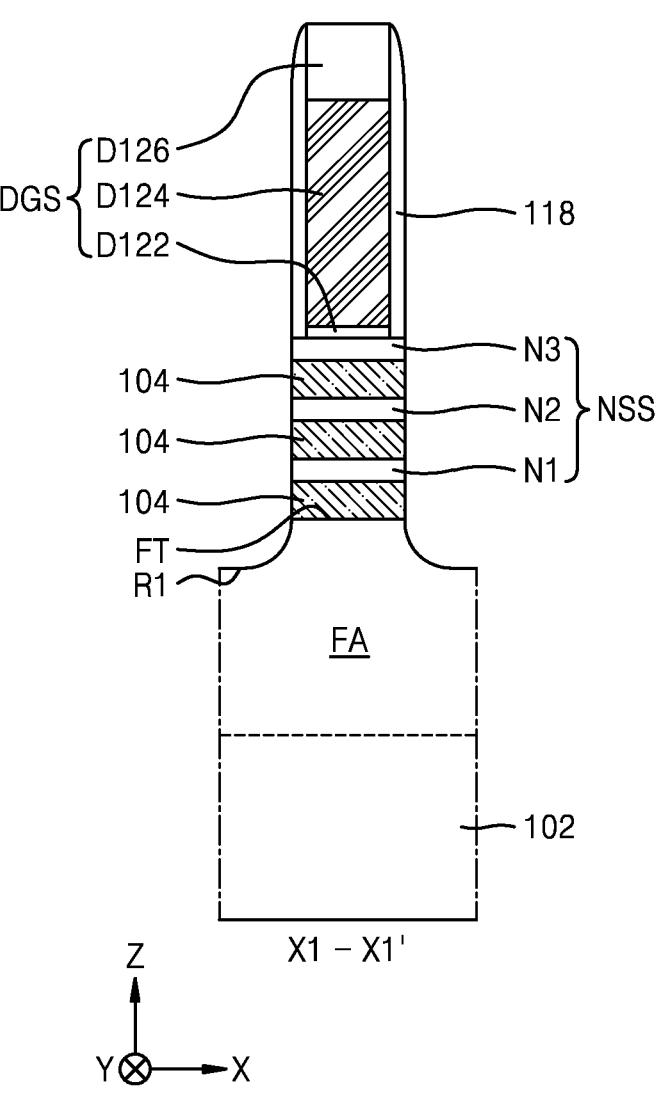

Referring to FIG. 12C, insulating spacers 118 may be formed to cover both sidewalls of the dummy gate structure DGS. Thereafter, respective portions of the plurality of sacrificial semiconductor layers 104, portions of the plurality of nanosheet semiconductor layers NS and portions of the fin-type active region FA may be etched by using the dummy gate structure DGS and the insulating spacers 118 as etch masks. Thus, the plurality of nanosheet semiconductor layers NS may be divided into a plurality of nanosheet stacks NSS, and a plurality of recesses R1 may be formed in an upper portion of the fin-type active region FA. Each of the plurality of nanosheet stacks NSS may include a first nanosheet N1, a second nanosheet N2, and a third nanosheet N3. To form the plurality of recesses R1, an etching process may be performed by using a dry etching process, a wet etching process, or a combination thereof.

Figure 12D:
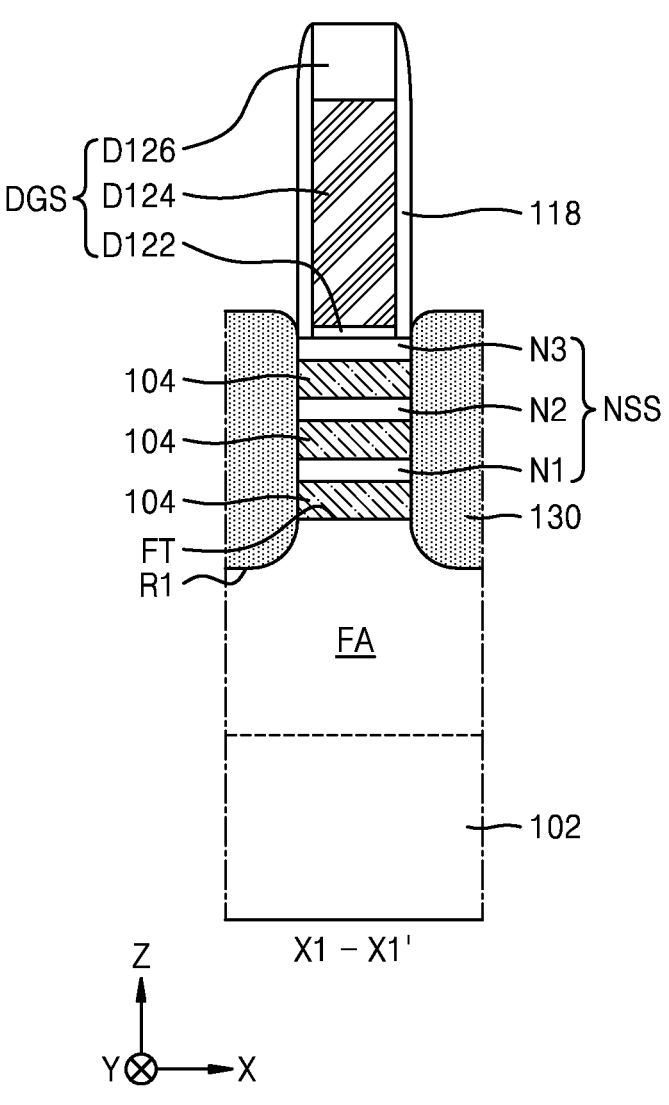

Referring to FIG. 12D, in the resultant structure of FIG. 12C, a plurality of source/drain regions 130 may be formed to fill the plurality of recesses R1.

To form the plurality of source/drain regions 130, a semiconductor material may be epitaxially grown from a surface of the fin-type active region FA exposed at a bottom surface of each of the plurality of recesses R1 and sidewalls of each of the first to third nanosheets N1, N2, and N3 included in the nanosheet stack NSS.

Figure 12E:
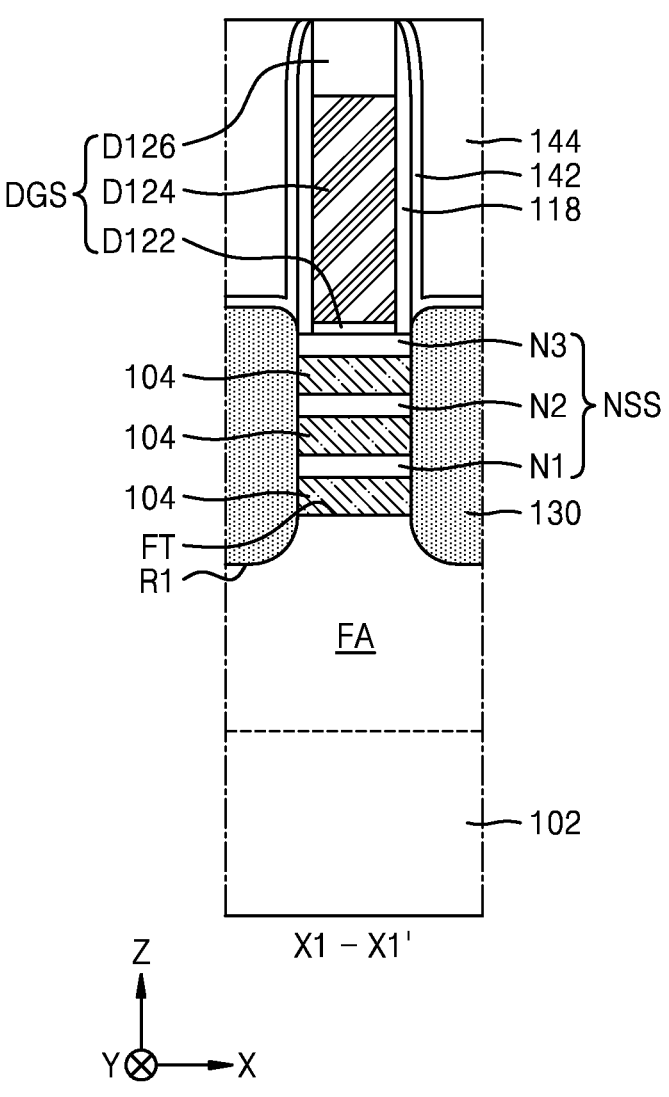

Referring to FIG. 12E, an insulating liner 142 may be formed to cover the resultant structure of FIG. 12D, and an inter-gate dielectric film 144 may be formed on the insulating liner 142. Thereafter, the insulating liner 142 and the inter-gate dielectric film 144 may be planarized to expose a top surface of the capping layer D126.

Figure 12F:
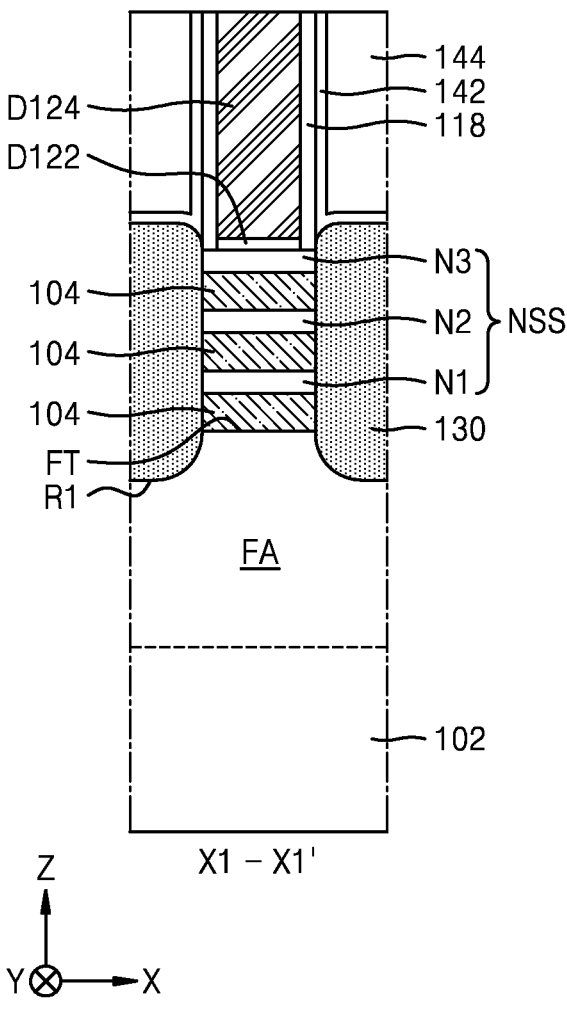

Referring to FIG. 12F, the capping layer D126 may be removed from the resultant structure of FIG. 12E to expose a top surface of the dummy gate layer D124. The insulating liner 142 and the inter-gate dielectric film 144 may be partially removed such that a top surface of the inter-gate dielectric film 144 is at substantially the same level as the top surface of the dummy gate layer D124.

Figure 12G:
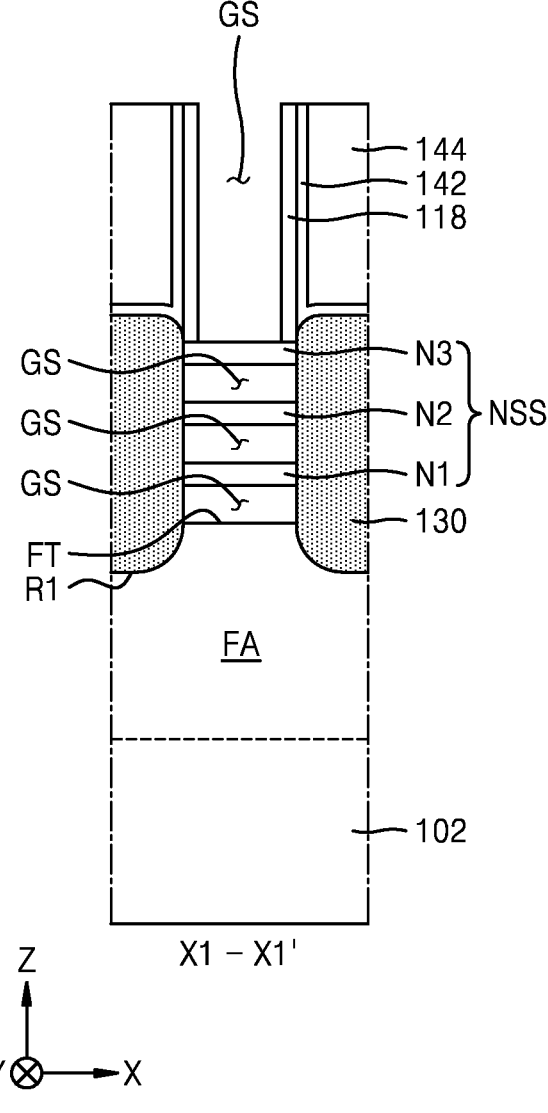

Referring to FIG. 12G, the dummy gate layer D124 and the oxide film D122 located thereunder may be removed from the resultant structure of FIG. 12F to form a gate space GS between the insulating spacers 118 and the source/drain regions 130 that exposes the plurality of nanosheet stacks NSS. Thereafter, the plurality of sacrificial semiconductor layers 104 remaining on the fin-type active region FA may be removed through the gate space GS. Thus, the gate space GS may extend to respective spaces between the first nanosheet N1, the second nanosheet N2, and the third nanosheet N3 and a space between the first nanosheet N1 and the fin top surface FT of the fin-type active region FA. In example embodiments, to selectively remove the plurality of sacrificial semiconductor layers 104, etch selectivities of the first to third nanosheets N1, N2, and N3 with respect to the plurality of sacrificial semiconductor layers 104 may be used.

Figure 12H:
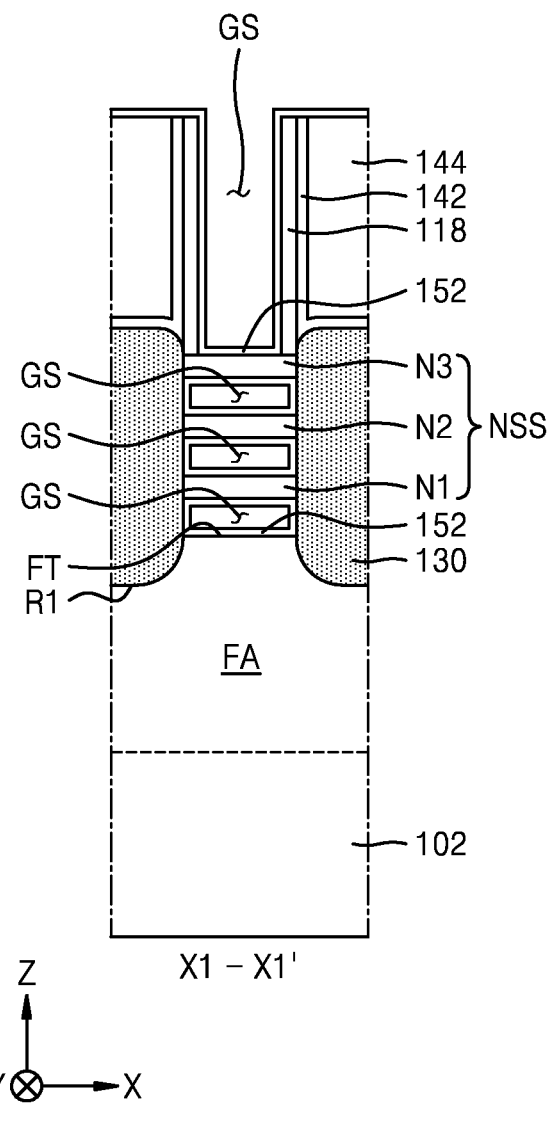

Referring to FIG. 12H, a first gate dielectric film 152 may be formed to cover the respective exposed surfaces of the first nanosheet N1, the second nanosheet N2, the third nanosheet N3, and the fin-type active region FA. The first gate dielectric film 152 may be formed by using an atomic layer deposition (ALD) process.

Figure 12I:
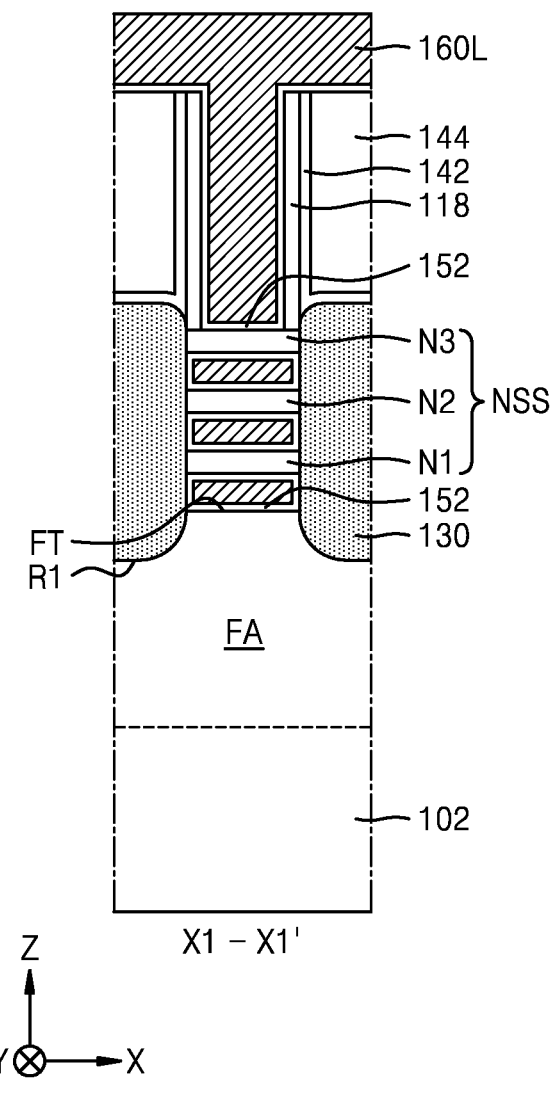

Referring to FIG. 12I, a gate-forming conductive layer 160L may be formed on the first gate dielectric film 152 to fill a gate space (refer to GS in FIG. 12H) and cover the top surface of the inter-gate dielectric film 144. The gate-forming conductive layer 160L may include a metal, a metal nitride, a metal carbide, or a combination thereof. The gate-forming conductive layer 160L may be formed by using an ALD process or a CVD process.

Figure 12J:
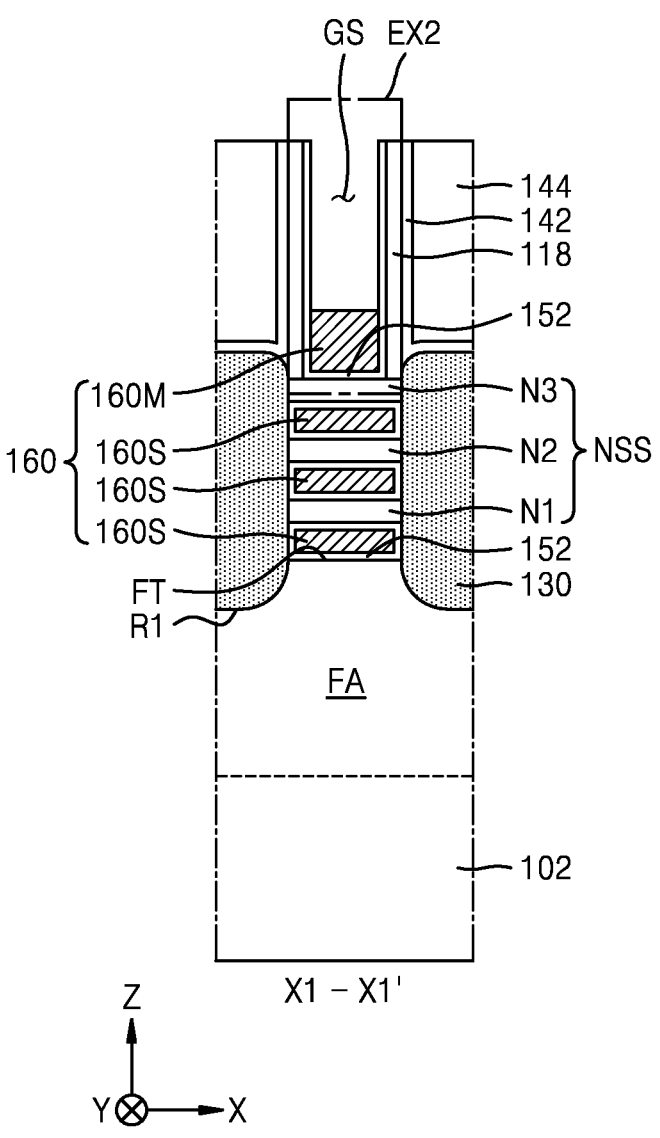

Referring to FIG. 12J, in the resultant structure of FIG. 12I, the gate-forming conductive layer 160L and the first gate dielectric film 152 may be partially removed from top surfaces thereof to expose the top surface of the inter-gate dielectric film 144 and empty an upper portion of the gate space GS. Thus, a gate line 160 may be formed.

Figure 12K:
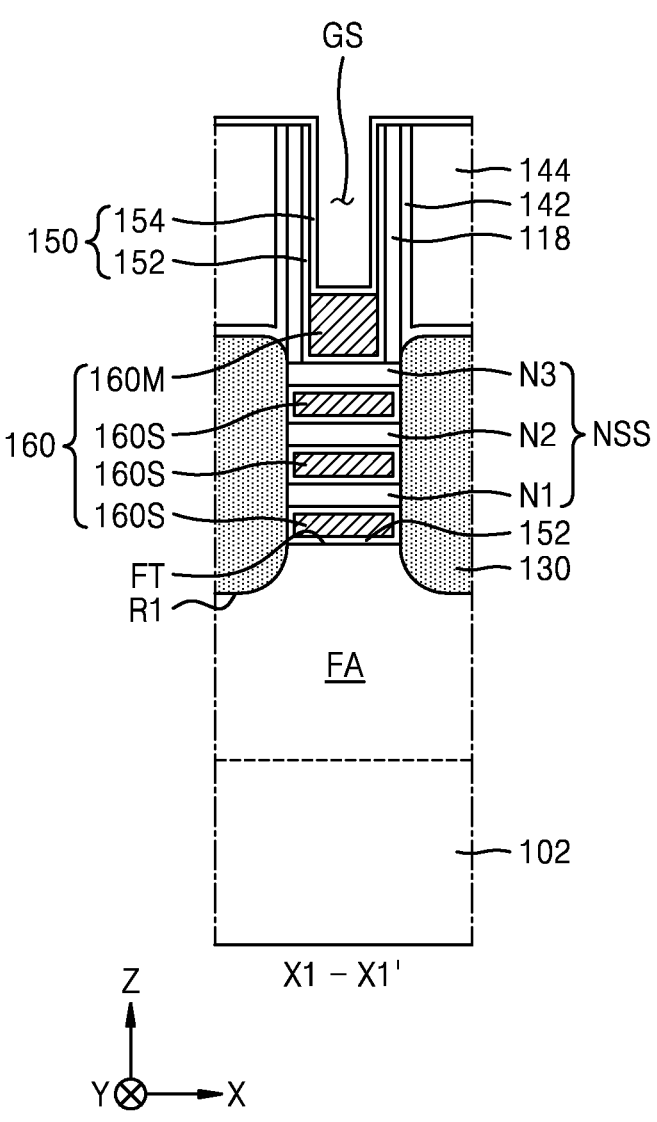

Referring to FIG. 12K, a second gate dielectric film 154 may be formed to conformally cover the exposed surfaces in the resultant structure of FIG. 12J. The second gate dielectric film 154 may be formed by using an ALD process. The first gate dielectric film 152 and the second gate dielectric film 154 may constitute a gate dielectric film 150.

Figure 12L:
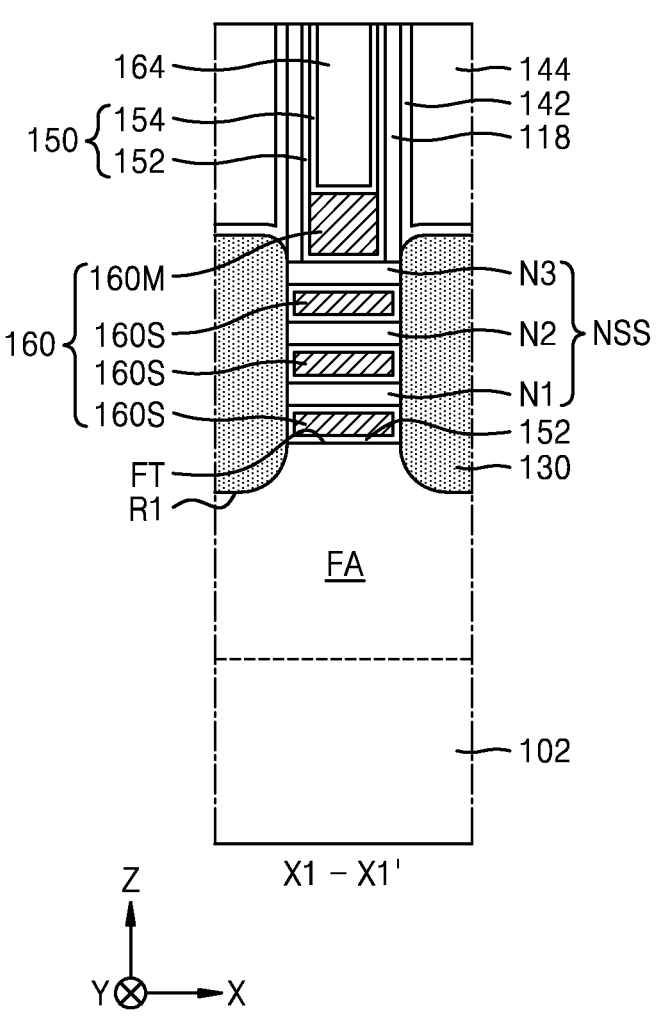

Referring to FIG. 12L, the second gate dielectric film 154 may be removed from top surfaces of the resultant structure of FIG. 12K to expose the top surface of the inter-gate dielectric film 144, and a capping insulating pattern 164 may be formed to fill the remaining space of the gate space (refer to GS in FIG. 12K) on the second gate dielectric film 154. As a result, the IC device 100 shown in FIGS. 2A to 2C may be manufactured.

Because the portions to be removed from the second gate dielectric film 154 are a sufficient distance apart from the first gate dielectric film 152, when the portions of the second gate dielectric film 154 are removed, adverse effects may be prevented. For example, damage to the first gate dielectric film 152 located thereunder or other components that may affect a work function or critical voltage of a transistor may be prevented. Accordingly, the electrical properties of a transistor including the gate dielectric film 150 may be prevented from deteriorating.

To manufacture the IC device 100 shown in FIG. 2D, in the resultant structure of FIG. 12L, a plurality of contact holes 170H may be formed to pass through the inter-gate dielectric film 144 and the insulating liner 142 in the vertical direction (Z direction) and expose the source/drain regions 130. Portions of the plurality of source/drain regions 130, which are exposed through the plurality of contact holes 170H, may be silicided to form a plurality of metal silicide films 172. A plurality of source/drain contacts 174 filling the contact holes 170H may be formed on the plurality of metal silicide films 172.

Figure 13A:
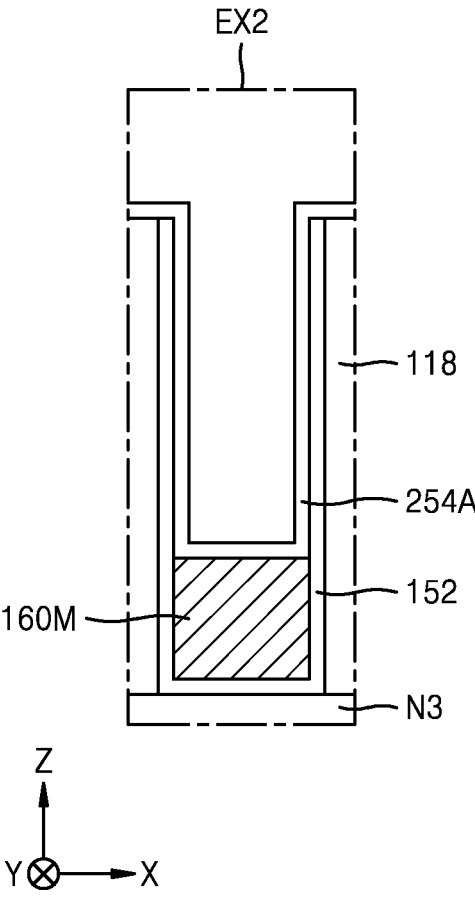
FIGS. 13A and 13B are cross-sectional views of a process sequence of a method of manufacturing an IC device, according to example embodiments.
Figure 13B:
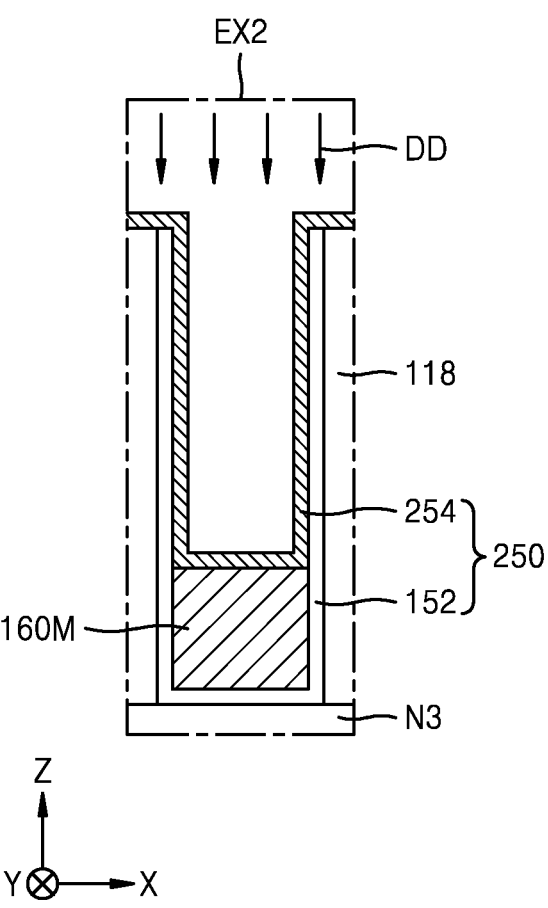

FIGS. 13A and 13B are cross-sectional views of a process sequence of a method of manufacturing an IC device, according to example embodiments. An example of a method of manufacturing the IC device 200 shown in FIGS. 3A and 3B will be described with reference to FIGS. 13A and 13B. FIGS. 13A and 13B illustrate an enlarged cross-sectional configuration of a local region "EX2" of FIG. 12J, according to a process sequence. In FIGS. 13A and 13B, the same reference numerals are used to denote the same elements as in FIGS. 1, 2A to 2C, 3A, and 3B, and detailed descriptions thereof are omitted.

Referring to FIG. 13A, after the processes described with reference to FIGS. 12A to 12J are performed, a preliminary second gate dielectric film 254A may be formed to conformally cover the exposed surfaces in the resultant structure of FIG. 12J. The preliminary second gate dielectric film 254A may include a high-k dielectric film including a metal oxide. In example embodiments, the high-k dielectric film may include the same material as the high-k dielectric film included in the first gate dielectric film 152, which has been described above with reference to FIGS. 2A to 2C. The preliminary second gate dielectric film 254A may be formed by using an ALD process.

Referring to FIG. 13B, in the resultant structure of FIG. 13A, a second gate dielectric film 254 may be formed by doping a dipole dopant DD into the preliminary second gate dielectric film 254A. The dipole dopant DD may include lanthanum (La), aluminum (Al), yttrium (Y), titanium (Ti), magnesium (Mg), niobium (Nb), boron (B), gallium (Ga), indium (In), europium (Eu), dysprosium (Dy), holmium (Ho), ytterbium (Yb), or a combination thereof, without being limited thereto. The first gate dielectric film 152 and the second gate dielectric film 254 may constitute a gate dielectric film 250.

Thereafter, similarly to that described with reference to FIG. 12K, the second gate dielectric film 254 may be removed from top surfaces of the resultant structure of FIG. 13A to expose the top surface of the inter-gate dielectric film 144, and a capping insulating pattern 164 may be formed on the second gate dielectric film 254. As a result, the IC device 200 shown in FIGS. 3A and 3B may be manufactured.

Because the portions to be removed from the second gate dielectric film 254 are a sufficient distance apart from the first gate dielectric film 152, when the portions of the second gate dielectric film 254 are removed, adverse effects may be prevented. For example, damage to the first gate dielectric film 152 located thereunder or other components that may affect a work function or critical voltage of a transistor may be prevented. Accordingly, the electrical properties of a transistor including the gate dielectric film 250 may be prevented from deteriorating.

Figure 14A:
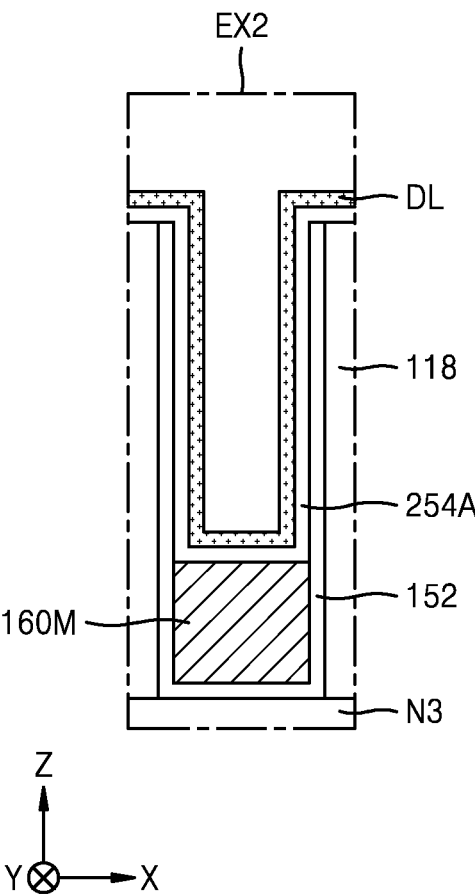
FIGS. 14A, 14B and 14C are cross-sectional views of a process sequence of a method of manufacturing an IC device, according to example embodiments.
Figure 14B:
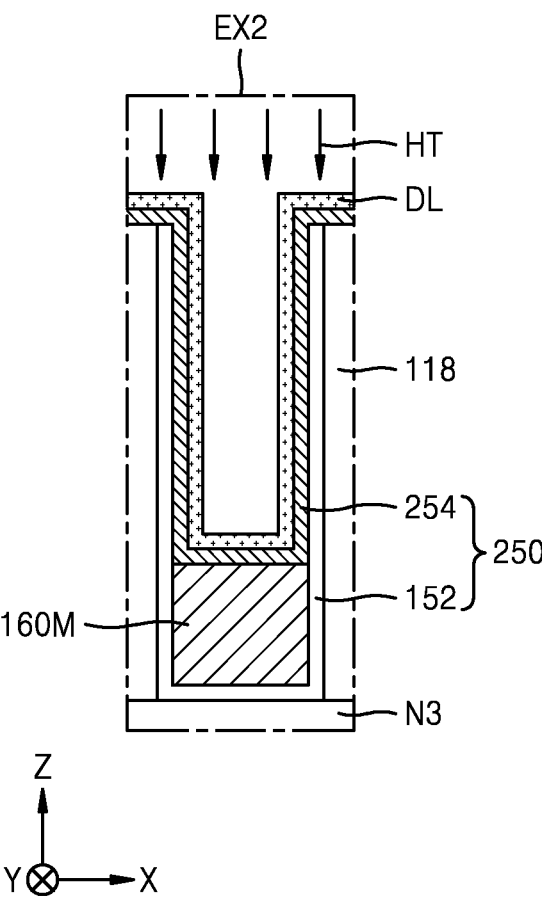
Figure 14C:
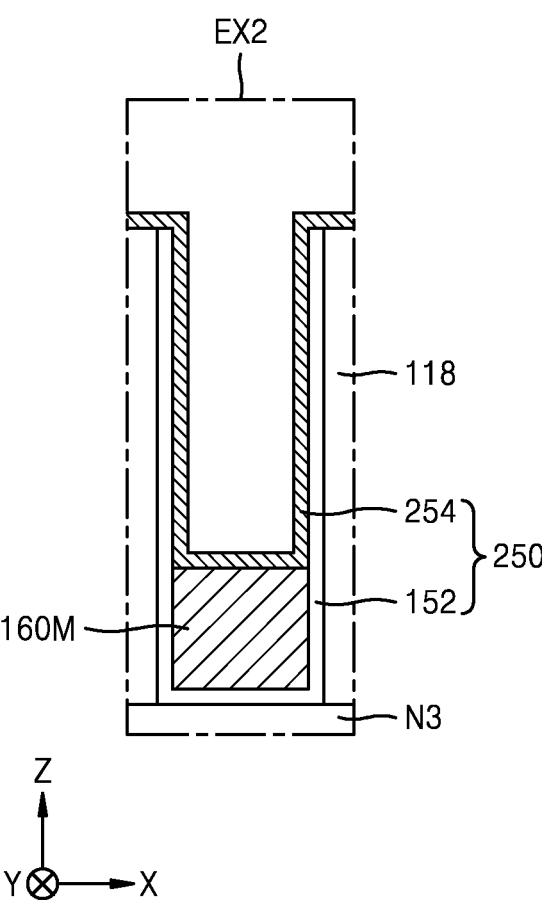

FIGS. 14A to 14C are cross-sectional views of a process sequence of a method of manufacturing an IC device, according to example embodiments. Another example of a method of manufacturing the IC device 200 shown in FIGS. 3A and 3B will be described with reference to FIGS. 14A to 14C. FIGS. 14A to 14C illustrate an enlarged cross-sectional configuration of the local region "EX2" of FIG. 12J, according to a process sequence. In FIGS. 14A to 14C, the same reference numerals are used to denote the same elements as in FIGS. 1, 2A to 2C, 3A, and 3B, and detailed descriptions thereof are omitted.

Referring to FIG. 14A, in the same manner as that described with reference to FIG. 13A, a preliminary second gate dielectric film 254A may be formed to conformally cover the exposed surfaces in the resultant structure of FIG. 12J. Thereafter, a dipole-inducing element-containing film DL may be formed to conformally cover the preliminary second gate dielectric film 254A. The dipole-inducing element-containing film DL may be formed by using an ALD process.

The dipole-inducing element-containing film DL may include a dipole-inducing element capable of forming a dipole in the gate dielectric film 250 to affect an effective work function of the gate dielectric film (refer to 250 in FIGS. 3A and 3B) to be formed. The dipole-inducing element may include lanthanum (La), aluminum (Al), yttrium (Y), titanium (Ti), magnesium (Mg), niobium (Nb), boron (B), gallium (Ga), indium (In), europium (Eu), dysprosium (Dy), holmium (Ho), ytterbium (Yb), or a combination thereof, without being limited thereto. The dipole-inducing film 356 may include an oxide of the dipole-inducing element, a nitride of the dipole-inducing element, or a combination thereof. In example embodiments, the dipole-inducing element-containing film DL may include the same material as that of the dipole-inducing film 356, which is described with reference to FIGS. 4A and 4B.

Referring to FIG. 14B, the resultant structure of FIG. 14A may be annealed by applying heat HT to the resultant structure of FIG. 14A, and thus, the dipole-inducing element in the dipole-inducing element-containing film DL may diffuse into the preliminary second gate dielectric film 254A. Thus, a second gate dielectric film 254 may be formed.

In example embodiments, the annealing process may be performed at a temperature that is selected in a range of about 500° C. to about 950° C. The annealing process may be performed for about 5 seconds to about 5 minutes. In example embodiments, the annealing process may be performed in the atmosphere of a process gas including $N_2$, $H_2$, $NH_3$, or a mixture thereof.

Referring to FIG. 14C, the dipole-inducing element-containing film DL may be removed from the resultant structure of FIG. 14B to expose the second gate dielectric film 254.

Thereafter, similarly to that described with reference to FIG. 12K, the second gate dielectric film 254 may be removed from top surfaces of the resultant structure of FIG. 14B to expose the top surface of the inter-gate dielectric film 144, and a capping insulating pattern 164 may be formed on the second gate dielectric film 254. As a result, the IC device 200 shown in FIGS. 3A and 3B may be manufactured.

In the process of removing the dipole-inducing element-containing film DL and the process of removing portions of the second gate dielectric film 254, because the portions to be removed from the dipole-inducing element-containing film DL and the second gate dielectric film 254 are a sufficient distance apart from the first gate dielectric film 152, when the portions of the dipole-inducing element-containing film DL and the second gate dielectric film 254 are removed, adverse effects may be prevented. For example, damage to the first gate dielectric film 152 located thereunder or other components that may affect a work function or critical voltage of a transistor may be prevented. Accordingly, the electrical properties of a transistor including the gate dielectric film 250 may be prevented from deteriorating.

Figure 15:
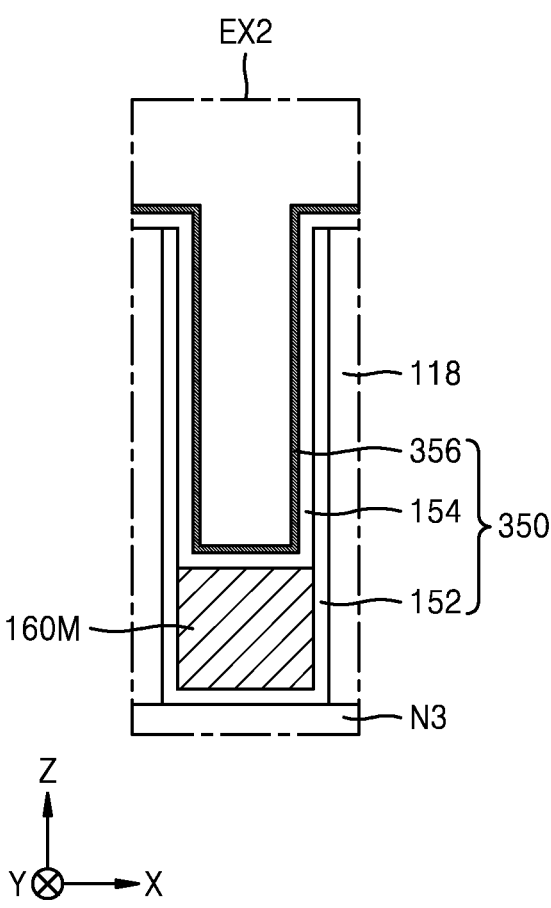
FIG. 15 is a cross-sectional view of a method of manufacturing an IC device, according to example embodiments.

FIG. 15 is a cross-sectional view of a method of manufacturing an IC device, according to example embodiments. An example of a method of manufacturing the IC device 300 shown in FIGS. 4A and 4B will be described with reference to FIG. 15. FIG. 15 illustrates an enlarged cross-sectional configuration of the local region "EX2" of FIG. 12J, according to a process sequence. In FIG. 15, the same reference numerals are used to denote the same elements as in FIGS. 4A and 4B, and detailed descriptions thereof are omitted.

Referring to FIG. 15, after the processes described with reference to FIGS. 12A to 12K are performed, a dipole-inducing film 356 may be formed to conformally cover an exposed surface of a second gate dielectric film 154 in the resultant structure of FIG. 12K. A first gate dielectric film 152, the second gate dielectric film 154, and the dipole-inducing film 356 may constitute a gate dielectric film 350. The dipole-inducing film 356 may be formed by using an ALD process.

Thereafter, the second gate dielectric film 154 and the dipole-inducing film 356 may be removed from top surfaces of the IC device shown in FIG. 15 to expose the top surface of the inter-gate dielectric film 144, and a capping insulating pattern 164 may be formed to fill the remaining space of the gate space (refer to GS in FIG. 12K) on the dipole-inducing film 356. As a result, the IC device 300 shown in FIGS. 4A and 4B may be manufactured.

Because the portions to be removed from the second gate dielectric film 154 and the dipole-inducing film 356 are a sufficient distance apart from the first gate dielectric film 152, when the portions of the second gate dielectric film 154 and the dipole-inducing film 356 are removed, adverse effects may be prevented. For example, damage to the first gate dielectric film 152 located thereunder or other components that may affect a work function or critical voltage of a transistor may be prevented. Accordingly, the electrical properties of a transistor including the gate dielectric film 350 may be prevented from deteriorating.

Although the methods of manufacturing the IC devices 100, 100A, 200, and 300 shown in FIGS. 1 to 4B have been described with reference to FIGS. 12A to 15, it will be understood that the IC devices 400, 400A, 400B, 700, 800, and 900 shown in FIGS. 5 to 11 and IC devices having variously changed structures may be manufactured by applying various modifications and changes to the processes described with reference to FIGS. 12A to 15 within the scope of the present disclosure.

While aspects of example embodiments have been particularly shown and described, it will be understood that various changes in form and details may be made therein without departing from the spirit and scope of the following claims.

What is claimed is:

1. An integrated circuit device comprising:
a channel region on a substrate;
a gate on the channel region;
a first gate dielectric film comprising a first portion and a second portion, the first portion being in contact with the channel region between the channel region and the gate, and the second portion being apart from the channel region; and
a second gate dielectric film comprising a third portion and a fourth portion, the third portion being in contact with the second portion of the first gate dielectric film at a vertical level farther from the substrate than a top surface of the gate, and the gate extending between the fourth portion and the channel region along a vertical direction.

2. The integrated circuit device of claim 1, wherein each of the first gate dielectric film and the second gate dielectric film comprises a high-k dielectric film comprising a common material.

3. The integrated circuit device of claim 1, wherein each of the first gate dielectric film and the second gate dielectric film comprises a high-k dielectric film, and
wherein the first gate dielectric film and the second gate dielectric film comprise different materials from each other.

4. The integrated circuit device of claim 1, wherein the first gate dielectric film comprises a first high-k dielectric film, and
wherein the second gate dielectric film comprises a second high-k dielectric film comprising a dipole dopant.

5. The integrated circuit device of claim 1, further comprising a dipole-inducing film in contact with the second gate dielectric film, the dipole-inducing film comprising a dipole-inducing element.

6. The integrated circuit device of claim 1, wherein the fourth portion of the second gate dielectric film is in contact with the top surface of the gate.

7. The integrated circuit device of claim 1, wherein each of the second portion of the first gate dielectric film and the third portion of the second gate dielectric film comprises a portion extending away from the substrate in the vertical direction.

8. The integrated circuit device of claim 1, wherein the second gate dielectric film is apart from the first portion of the first gate dielectric film along the vertical direction with the gate therebetween.

9. The integrated circuit device of claim 1, further comprising a pair of source/drain regions apart from each other along a lateral direction with an active region and the gate therebetween, wherein a lowermost surface of the second gate dielectric film is farther from the substrate than uppermost surfaces of the pair of source/drain regions.

10. The integrated circuit device of claim 1, further comprising a capping insulating pattern covering the top surface of the gate with the second gate dielectric film therebetween, wherein a bottom surface and both sidewalls of the capping insulating pattern are in contact with the second gate dielectric film.

11. The integrated circuit device of claim 1, further comprising a fin-type active region extending in a first lateral direction on the substrate, wherein the channel region comprises at least one nanosheet on the fin-type active region, wherein the gate extends in a second lateral direction and surrounds the at least one nanosheet on the fin-type active region, wherein the second lateral direction intersects the first lateral direction, wherein the first gate dielectric film is in contact with the at least one nanosheet, and wherein the second gate dielectric film is apart from the at least one nanosheet in the vertical direction.

12. The integrated circuit device of claim 1, further comprising a fin-type active region extending in a first lateral direction on the substrate, wherein the channel region comprises a main channel region on and integrally connected to the fin-type active region, wherein the gate surrounds the main channel region on the fin-type active region, wherein the first gate dielectric film is in contact with the main channel region, and wherein the second gate dielectric film is apart from the main channel region in the vertical direction.

13. An integrated circuit device comprising:

a first fin-type active region extending in a first lateral direction on a first region of a substrate;

a first channel region on the first fin-type active region;

a first gate surrounding the first channel region on the first fin-type active region, the first gate extending in a second lateral direction that intersects the first lateral direction;

a first gate dielectric film comprising a first portion and a second portion, the first portion being in contact with the first channel region between the first channel region and the first gate, and the second portion being apart from the first channel region; and a second gate dielectric film comprising a third portion and a fourth portion, the third portion being in contact with the second portion of the first gate dielectric film at a vertical level farther from the substrate than a top surface of the first gate, and the first gate extending between the fourth portion and the first channel region along a vertical direction.

14. The integrated circuit device of claim 13, wherein the first gate dielectric film comprises a first high-k dielectric film, the second gate dielectric film comprises a second high-k dielectric film, and the first high-k dielectric film and the second high-k dielectric film comprise a common high-k dielectric material.

15. The integrated circuit device of claim 13, wherein the first gate dielectric film comprises a first high-k dielectric film, the second gate dielectric film comprises a second high-k dielectric film, and the first high-k dielectric film and the second high-k dielectric film comprise different high-k dielectric materials from each other.

16. The integrated circuit device of claim 13, wherein the second gate dielectric film comprises a high-k dielectric film comprising a dipole dopant.

17. The integrated circuit device of claim 13, further comprising a dipole-inducing film in contact with the second gate dielectric film, the dipole-inducing film comprising a dipole-inducing element, wherein the dipole-inducing film is apart from the first gate and the first gate dielectric film with the second gate dielectric film therebetween.

18. The integrated circuit device of claim 13, wherein the fourth portion of the second gate dielectric film is apart from the first channel region, and is in contact the top surface of the first gate, and wherein the fourth portion of the second gate dielectric film is apart from the first portion of the first gate dielectric film along the vertical direction with the first gate therebetween.

19. The integrated circuit device of claim 13, further comprising:

a second fin-type active region on a second region of the substrate;

a second channel region on the second fin-type active region;

a second gate surrounding the second channel region on the second fin-type active region;

a third gate dielectric film comprising a fifth portion and a sixth portion, the fifth portion being in contact with the second channel region between the second channel region and the second gate, and the sixth portion being apart from the second channel region; and a fourth gate dielectric film comprising a seventh portion, the seventh portion being in contact with the sixth portion of the second gate dielectric film at a vertical level farther from the substrate than a top surface of the second gate, wherein the fourth gate dielectric film comprises a high-k dielectric film not comprising a dipole dopant, the high-k dielectric film comprising the dipole dopant or a combination thereof.

20. An integrated circuit device comprising:

a fin-type active region on a substrate;

a channel region on the fin-type active region;

a gate surrounding the channel region on the fin-type active region;

a pair of source/drain regions on both sides of the channel region on the fin-type active region;

a first gate dielectric film comprising a first portion and a second portion, the first portion being in contact with the channel region between the channel region and the gate, and the second portion being apart from the channel region;

a second gate dielectric film comprising a third portion and a fourth portion, the third portion being in contact with the second portion of the first gate dielectric film at a vertical level farther from the substrate than a top surface of the gate, and the fourth portion being in contact with the top surface of the gate;

a capping insulating pattern covering the top surface of the gate with the second gate dielectric film therebetween; and insulating spacers covering sidewalls of each of the gate and the capping insulating pattern, wherein each of the second portion of the first gate dielectric film and the third portion of the second gate dielectric film comprises a portion extending in a vertical direction between the capping insulating pattern and the insulating spacers, and wherein the second gate dielectric film comprises a high-k dielectric film not comprising a dipole dopant, the high-k dielectric film comprising the dipole dopant or a combination thereof.

* * * * *